United States Patent
Ito et al.

(10) Patent No.: US 7,015,256 B2
(45) Date of Patent: Mar. 21, 2006

(54) COMPOSITION FOR FORMING PHOTOSENSITIVE DIELECTRIC MATERIAL, AND TRANSFER FILM, DIELECTRIC MATERIAL AND ELECTRONIC PARTS USING THE SAME

(75) Inventors: Nobuyuki Ito, Tokyo (JP); Hideaki Masuko, Tokyo (JP); Satomi Hasegawa, Tokyo (JP); Atsushi Ito, Tokyo (JP); Katsumi Inomata, Tokyo (JP)

(73) Assignee: JSR Corporation, Tokyo (JP)

( * ) Notice: Subject to any disclaimer, the term of this patent is extended or adjusted under 35 U.S.C. 154(b) by 84 days.

(21) Appl. No.: 10/472,940

(22) PCT Filed: Dec. 26, 2002

(86) PCT No.: PCT/JP02/13662

§ 371 (c)(1),
(2), (4) Date: Sep. 26, 2003

(87) PCT Pub. No.: WO03/065384

PCT Pub. Date: Aug. 7, 2003

(65) Prior Publication Data

US 2004/0094752 A1 May 20, 2004

(30) Foreign Application Priority Data

| Jan. 28, 2002 | (JP) | ............................. 2002-018388 |
| Jan. 28, 2002 | (JP) | ............................. 2002-018389 |
| Jun. 6, 2002 | (JP) | ............................. 2002-166087 |

(51) Int. Cl.
*C08F 2/46* (2006.01)
*H01B 3/10* (2006.01)
*G03C 1/725* (2006.01)

(52) U.S. Cl. ............................. 522/81; 522/71; 522/96; 522/100; 522/104; 522/150; 522/152; 522/153; 522/154; 522/157; 522/160; 522/67; 522/65; 522/62; 522/46; 522/164; 252/570; 252/572; 252/578; 430/170; 430/189; 430/193; 430/197; 430/194

(58) Field of Classification Search ................. 522/71, 522/81, 90, 96, 100, 104, 150, 152, 153, 522/154, 157, 160, 164, 47, 48, 46, 62, 65, 522/67; 252/570, 572, 578; 430/56, 154, 430/165, 170, 189, 193, 194, 197
See application file for complete search history.

(56) References Cited

U.S. PATENT DOCUMENTS

| 5,773,519 | A * | 6/1998 | Ito et al. ...................... 525/276 |
| 5,967,964 | A * | 10/1999 | Hattori et al. ................. 516/81 |
| 6,146,749 | A * | 11/2000 | Miyamoto et al. ........ 428/320.2 |
| 6,214,923 | B1 * | 4/2001 | Goto et al. .................. 524/514 |
| 6,306,355 | B1 * | 10/2001 | Delmau et al. ................. 423/9 |
| 6,534,235 | B1 * | 3/2003 | Hanabata et al. ........... 430/191 |
| 6,593,043 | B1 * | 7/2003 | Suwa et al. ................... 430/18 |
| 6,723,484 | B1 * | 4/2004 | Tomikawa et al. .......... 430/192 |
| 6,790,596 | B1 * | 9/2004 | Kubota et al. ........... 430/281.1 |
| 2003/0143407 | A1 * | 7/2003 | Yamasaki et al. ........... 428/447 |
| 2003/0151032 | A1 * | 8/2003 | Ito et al. ..................... 252/570 |

FOREIGN PATENT DOCUMENTS

| JP | 2000-7383 | 1/2000 |
| JP | 2000-90738 | 3/2000 |
| JP | 2001-206979 | 7/2001 |
| JP | 2001-264966 | 9/2001 |
| JP | 2001-264967 | 9/2001 |
| JP | 2001-264973 | 9/2001 |

OTHER PUBLICATIONS

U.S. Appl. No. 10/472,940, filed Sep. 26, 2003, Ito et al.
U.S. Appl. No. 10/475,084, filed Oct. 23, 2003, Inomata et al.
J. Kosar, Light-Sensitive Systems, John Wiley & Sons, pp. 339-352, 1965.
W.S. De Forest, Photoresist, McGraw-Hill, Inc., pp. 50-55, 1975.

* cited by examiner

Primary Examiner—Sanza L. McClendon
(74) Attorney, Agent, or Firm—Oblon, Spivak, McClelland, Maier & Neustadt, P.C.

(57) ABSTRACT

A photosensitive composition for forming a dielectric of the present invention comprising inorganic particles, an alkali developable resin and additives, wherein the additives comprise a compound having a quinonediazido group (C1), a compound containing at least two alkyletherified amino groups in the molecule (C2) and a thermal acid generator (C3), or wherein the inorganic particles comprise inorganic superfine particles (A-I) having a mean particle diameter of less than 0.05 $\mu$m and inorganic fine particles (A-II) having a mean particle diameter of not less than 0.05 $\mu$m.

The composition can be calcined at low temperatures to form a dielectric layer with high dimensional precision, said layer having a high dielectric constant and a low dielectric loss. Also provided are a dielectric and an electronic part prepared from the composition.

17 Claims, No Drawings

COMPOSITION FOR FORMING PHOTOSENSITIVE DIELECTRIC MATERIAL, AND TRANSFER FILM, DIELECTRIC MATERIAL AND ELECTRONIC PARTS USING THE SAME

FIELD OF THE INVENTION

The present invention relates to a photosensitive composition for forming a dielectric, the composition being suitably employable to form a pattern with high dimensional precision; a transfer film obtained by applying the photosensitive composition onto a substrate film; and a dielectric and electronic parts prepared from the composition or the transfer film.

BACKGROUND OF THE INVENTION

It is now a known technology to incorporate a high-dielectric layer into a multilayer printed circuit board etc. to obtain a function of condenser or the like. The high-dielectric layer can be prepared by, for example, adding inorganic powder of high dielectric constant to a solution obtained by dissolving a thermosetting resin in an organic solvent; impregnating a fibrous reinforcing material such as glass fiber with the solution to make up for the brittleness of the thermosetting resin; and calcining the impregnated material to evaporate the solvent and cure the resin. However, it has been difficult with such conventional methods to obtain a dielectric layer which has a high dielectric constant, generally 20 or more, and which is at the same time thin and has a low leakage current.

Further, various inorganic powders have been used in attempts to obtain a dielectric layer of a high dielectric constant. For example, it has been found that a dielectric layer having a high dielectric constant can be prepared by addition of an inorganic powder, such as of $Fe_3O_4$ or a mixture of ZnO and carbon, into polystyrene. However, dielectric layers thus obtained, although high in dielectric constant, have a high dielectric loss so that they generate high heat in an alternating electric field. This heat generation causes deterioration of multilayer printed circuit boards etc. including the dielectric film, and further gives rise to troubles such as breakage of joint by thermal stress. Accordingly, there have been problems of poor reliability and durability of the semiconductor boards.

On the other hand, it is a known method for achieving a high dielectric constant to form a dielectric layer by calcining an inorganic powder of high dielectric constant at high temperatures. However, due to the calcination which should be carried out at high temperatures around 1000° C., this method cannot be applied to uses where a dielectric layer is to be incorporated in a wiring board carrying electronic parts. Thus, it has been impossible to apply this method to versatile uses in the production of various kinds of semiconductor boards.

A screen printing process is a known method for forming dielectric layers. This screen printing process has been unable to deal with difficult demands for accurate pattern position that come from the recent trends of boards toward large size and meticulous structure.

Accordingly, there has been a demand for a photosensitive composition for forming a dielectric which can be calcined at low temperatures to form a dielectric layer that has a high dielectric constant and a low dielectric loss and is patterned with high dimensional precision.

OBJECT OF THE INVENTION

The present invention has been made in order to solve the above problems related to the prior art. Accordingly, it is an object of the invention to provide a photosensitive composition for forming a dielectric which can be calcined at low temperatures to give a dielectric layer that has a high dielectric constant and a low dielectric loss and is patterned with high dimensional precision. It is a further object of the invention to provide a photosensitive transfer film having a layer of the above composition, a dielectric prepared from the composition or the transfer film, and electronic parts including the dielectric.

DISCLOSURE OF THE INVENTION

As a result of an earnest study dedicated to solving the above problems, the present inventors have found that a photosensitive composition for forming a dielectric or a photosensitive transfer film can be calcined at low temperatures not higher than 500° C. to give a dielectric layer that has a high dielectric constant, a low dielectric loss and a low leakage current in spite of small thickness and further which can be patterned with high dimensional precision. The photosensitive composition comprises inorganic particles, an alkali-soluble resin and an additive(s), the additive(s) is a specific kind(s) or the inorganic particles have a specific mean particle diameter. The photosensitive transfer film is coated with the above composition. The invention has been completed based on these findings.

A first photosensitive composition for forming a dielectric according to the invention comprises (A) inorganic particles, (B) an alkali developable resin, and (C) additives, wherein:

the alkali developable resin (B) comprises an alkali soluble resin having a phenolic hydroxyl group (B1); and the additives (C) comprise a compound having a quinonediazido group (C1), a compound containing at least two alkyletherified amino groups in the molecule (C2) and a thermal acid generator (C3).

In the first photosensitive composition, the alkali developable resin (B) comprises preferably an alkali soluble resin having a phenolic hydroxyl group (B1), and the additives (C) comprise preferably a compound having a quinonediazido group (C1), a compound containing at least two alkyletherified amino groups in the molecule (C2), a thermal acid generator (C3) and crosslinked fine particles (C4).

Preferably, the crosslinked fine particles (C4) have a mean particle diameter of 30 to 500 nm.

A second photosensitive composition for forming a dielectric comprises (A) inorganic particles, (B) an alkali developable resin, and (C) an additive, wherein:

the inorganic particles (A) comprise inorganic superfine particles (A-I) having a mean particle diameter of less than 0.05 μm and inorganic fine particles (A-II) having a mean particle diameter of not less than 0.05 μm; and the additive (C) comprises a photoacid generator (C5).

Preferably, the inorganic particles (A) are contained at 20 to 95% by mass, the alkali developable resin (B) is contained at 1 to 60% by mass and the photoacid generator (C5) is contained at 0.1 to 30% by mass.

In the second photosensitive composition, the alkali developable resin (B) is preferably at least one resin selected from the group consisting of a (meth)acrylic resin, a hydroxystyrene resin, a novolak resin, a polyester resin, a polyimide resin, a nylon resin and a polyetherimide resin.

A third photosensitive composition for forming a dielectric comprises (A) inorganic particles, (B) an alkali developable resin, and (C) additives, wherein:

the inorganic particles (A) comprise inorganic superfine particles (A-I) having a mean particle diameter of less than 0.05 μm and inorganic fine particles (A-II) having a mean particle diameter of not less than 0.05 μm;

the alkali developable resin (B) comprises an alkali soluble resin (B2); and the additives (C) comprise a compound having an ethylenically unsaturated group (C6) and a photopolymerization initiator (C7).

Preferably, the inorganic particles (A) are contained at 20 to 95% by mass, the alkali soluble resin (B2) is contained at 1 to 60% by mass, the compound having an ethylenically unsaturated group (C6) is contained at 0.1 to 30% by mass, and the photopolymerization initiator (C7) is contained at 0.1 to 20% by mass.

The alkali soluble resin (B2) is preferably a resin selected from the group consisting of a (meth)acrylic resin, a hydroxystyrene resin, a novolak resin and a polyester resin. The compound having an ethylenically unsaturated group (C6) is preferably a (meth)acrylate compound, and is preferably contained at 20 to 500 parts by mass based on 100 parts by mass of the alkali soluble resin (B2).

In the second or third photosensitive composition, the inorganic superfine particles (A-I) are preferably contained at 1 to 30 parts by mass and the inorganic fine particles (A-II) are contained at 99 to 70 parts by mass on the basis of 100 parts by mass of the inorganic particles (A). The inorganic particles (A) preferably comprise a titanium-containing metal oxide.

Preferably, the second or third photosensitive composition is capable of forming a dielectric by heating at 500° C. or below, said dielectric having a dielectric constant of not less than 20 and a dielectric loss tangent of not more than 0.1.

A photosensitive transfer film according to the invention is a substrate film and a layer of a photosensitive composition for forming a dielectric comprising inorganic particles (A), an alkali developable resin (B) and an additive (C), said layer being provided in a thickness of 1 to 100 μm on the substrate film, wherein:

the inorganic particles (A) comprise inorganic superfine particles (A-I) having a mean particle diameter of less than 0.05 μm and inorganic fine particles (A-II) having a mean particle diameter of not less than 0.05 μm; and the additive (C) comprises a photoacid generator (C5).

Preferably, the photosensitive transfer film is capable of forming a dielectric by heating at 500° C. or below, said dielectric having a dielectric constant of not less than 20 and a dielectric loss tangent of not more than 0.1.

In the photosensitive transfer film, the inorganic particles (A) preferably comprise a titanium-containing metal oxide, and the alkali developable resin (B) is preferably a resin selected from the group consisting of a (meth)acrylic resin, a hydroxystyrene resin, a novolak resin, a polyester resin, a polyimide resin, a nylon resin and a polyetherimide resin.

A dielectric according to the invention is prepared from any of the first to third photosensitive compositions. Preferably, the dielectric is prepared by heating the second or third photosensitive composition at 500° C. or below to cure the same, and has a dielectric constant of not less than 20 and a dielectric loss tangent of not more than 0.1. Also preferably, the dielectric is formed with use of the photosensitive transfer film.

The dielectric may be a dielectric with a conductive foil, in which a dielectric obtained from the second photosensitive composition or from the photosensitive transfer film is formed on the conductive foil.

An electronic part according to the invention include the dielectric.

PREFERRED EMBODIMENTS OF THE INVENTION

The detailed description of the invention will begin with explanation of the photosensitive compositions for forming a dielectric.

The photosensitive compositions can be prepared by kneading inorganic particles (A), an alkali developable resin (B) and an additive(s) (C) by use of a kneader such as a roll mill, a mixer, a homomixer, a ball mill or a bead mill.

First Photosensitive Composition for Forming Dielectric

The first photosensitive composition for forming a dielectric comprises:

(A) inorganic particles;

(B) an alkali developable resin which is an alkali soluble resin having a phenolic hydroxyl group (B1);

(C) additives which are a compound having a quinonediazido group (C1), a compound containing at least two alkyletherified amino groups in the molecule (C2) and a thermal acid generator (C3); and optionally (C4) crosslinked fine particles and (D) a solvent.

When necessary, this first photosensitive composition may contain another additive (E) such as an epoxy compound, an adhesion auxiliary or a leveling agent.

The first photosensitive composition thus prepared is in paste form with a fluidity sufficient for coating applications. Ideally, the viscosity thereof ranges from 10 to 50,000 mPa·s, and preferably from 20 to 10,000 mPa·s.

Hereinafter, each component of the first photosensitive composition will be described.

(A) Inorganic Particles:

The inorganic particles (A) used in the first photosensitive composition desirably have a dielectric constant of not less than 30, preferably not less than 50, and more preferably not less than 70. The upper limit of the dielectric constant is not particularly limited. That is, there is no problem even if the dielectric constant is as high as 30,000.

The inorganic particles (A) are preferably particles of a metal oxide, particularly those of a titanium-containing metal oxide. The "titanium-containing metal oxide" used herein refers to a compound that contains titanium and oxygen as essential elements. Preferred examples of the titanium-containing metal oxide include a titanium-containing monometal oxide which contains titanium as the only metallic element to form a crystalline structure or a titanium-containing compound oxide which contains titanium and another metallic element.

Exemplary titanium-containing monometal oxides include titanium dioxide-based compounds, which will have an anatase structure or a rutile structure.

Exemplary titanium-containing compound oxides include barium titanate-based, lead titanate-based, strontium titanate-based, bismuth titanate-based, magnesium titanate-based, neodymium titanate-based and calcium titanate-based compound oxides.

The "titanium dioxide-based compound" is defined as a compound formed from titanium dioxide alone or from titanium dioxide and a minor additive. This compound retains a crystalline structure of its principal component, titanium dioxide. These definitions apply to other monometal oxides.

The "titanium-containing compound oxide" means a compound oxide which is formed from a titanium-containing monometal oxide and at least one different metal oxide. The complex oxide is free of oxo-ion structural units.

For the titanium-containing metal oxide for making up the inorganic particles (A) of the first photosensitive composition, a titanium dioxide-based compound with a rutile structure and barium titanate are preferred among the titanium monometal oxide and the titanium-containing compound oxide, respectively.

Of these, barium titanate can be particularly preferably used.

The inorganic particles preferably have a mean particle diameter of 0.005 to 2.0 μm, more preferably 0.02 to 1.0 μm, still preferably 0.02 to 0.8 μm, and particularly preferably 0.02 to 0.3 μm. Further, the inorganic particles preferably have a Dw/Dn ratio (Dw: weight-average particle diameter, Dn: number-average particle diameter) of not less than 1.05, more preferably not less than 1.1, still preferably not less than 1.2, and particularly preferably not less than 1.25. With the Dw/Dn ratio being less than 1.05, those dielectric particles will have a low packing density when a dielectric layer is formed thin so that the leakage current may increase.

The inorganic particles (A) used in the first photosensitive composition may be in the shape of, although not particularly limited to, sphere, granule, plate, scale, whisker, bar or filament. Of these shapes, the inorganic particles preferably have a spherical, granular, plate or scale shape. The inorganic particles (A) in the above shapes may be used either singly or in combination of two or more kinds.

The inorganic particles (A) to be used in the first photosensitive composition may be synthesized by, for example, a gas phase process, a sol-gel process or an RF plasma process when the inorganic particles have been synthesized by a gas phase process, they can be dispersed in a solvent by means of a conventional dispersing means with combined use of a dispersant, a bead mill, a kneader or a high-pressure homogenizer to be disrupted into primary particles.

Preferably, the first photosensitive composition contains the inorganic particles (A) at 20 to 85% by mass, more preferably 30 to 85% by mass, and still preferably 40 to 85% by mass based on 100% by mass of the total amount of the components (A), (B1), (C1), (C2), (C3) and (C4).

(B1) Alkali Soluble Resin Containing Phenolic Hydroxyl Group:

The alkali soluble resin having a phenolic hydroxyl group (B1) (hereinafter referred to as the "phenolic resin (B1)") for use in this first photosensitive composition is preferably a novólak resin but is not particularly limited thereto. The novolak resin can be obtained by condensing a phenol and an aldehyde in the presence of a catalyst.

Examples of the phenol used herein include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol and β-naphthol.

Examples of the aldehyde include formaldehyde, paraformaldehyde, acetaldehyde and benzaldehyde.

Exemplary novolak resins obtainable from these include phenol/formaldehyde condensate novolak resins, cresol/formaldehyde condensate novolak resins and phenol-naphthol/formaldehyde condensate novolak resins.

Exemplary phenolic resins (B1) other than the novolak resins include polyhydroxystyrene, copolymers thereof, phenol/xylyleneglycol condensate resins, cresol/xylyleneglycol condensate resins and phenol/dicyclopentadiene condensate resins.

In the first photosensitive composition, a phenolic low-molecular-weight compound (hereinafter the "phenolic compound (b1)") other than the above phenolic resin (B1) may be used together with the phenolic resin (B1). Exemplary phenolic compounds include 4,4'-dihydroxydiphenylmethane, 4,4'-dihydroxydiphenylether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, and 1,1,2,2-tetra(4-hydroxyphenyl)ethane. Preferably, the phenolic compound (b1) is contained at 0 to 40% by mass, more preferably 0 to 30% by mass, and particularly preferably 1 to 20% by mass based on the total amount of the phenolic resin (B1) and the phenolic compound (b1).

It is necessary that the phenolic resin (B1) have a mass-average molecular weight of at least 2,000, particularly from 2,000 to about 20,000, in consideration of resolution, thermal shock properties and heat resistance of the resulting dielectric layer.

The first photosensitive composition contains the phenolic resin (B1) (and the phenolic compound (b1) when it is used in combination) at 10 to 50% by mass, and preferably 13 to 45% by mass of the total amount of the components (A), (B1), (b1), (C1), (C2), (C3) and (C4). When the composition contains the phenolic resin (B1) in the above proportion, the dielectric layer formed from the composition can exhibit a sufficient developability by an alkaline aqueous solution.

(C1) Compound having Quinonediazido Group:

The compound having a quinonediazido group (C1) (hereinafter referred to as the "quinonediazide compound (C1)") used in the first photosensitive composition is an ester formed between either 1,2-naphthoquinonediazido-4-sulfonic acid or 1,2-naphthoquinonediazido-5-sulfonic acid and a compound having at least one phenolic hydroxyl group. The compound having at least one phenolic hydroxyl group is not particularly limited; preferably it has a structure represented by any of the following formulae:

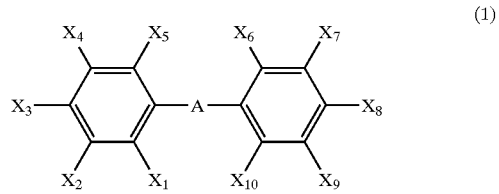

wherein $X_1$ to $X_{10}$ independently denote a hydrogen atom, an alkyl group of 1 to 4 carbon atoms, an alkoxy group 1 to 4 carbon atoms or a hydroxyl group provided, however, that at least one of $X_1$ to $X_5$ is a hydroxyl group; and A is a single bond, O, S, $CH_2$, $C(CH_3)_2$, $C(CF_3)_2$, C=O or $SO_2$;

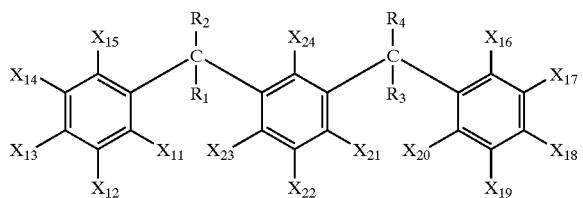

(2)

wherein $X_{11}$ to $X_{24}$, which may be the same or different, are the same definition as $X_1$ to $X_{10}$ provided, however, that least one of $X_{11}$ to $X_{15}$ is a hydroxyl group; and $R_1$ to $R_4$ independently denote a hydrogen atom or an alkyl group 1 to 4 carbon atoms;

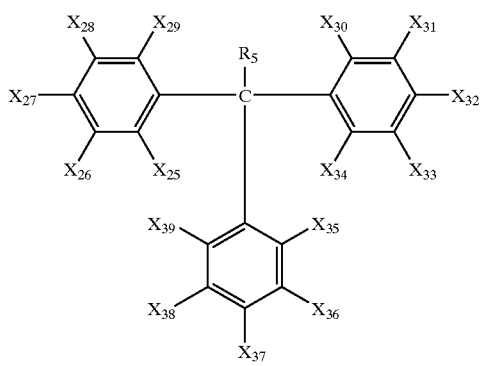

(3)

wherein $X_{25}$ to $X_{39}$, which may be the same or different, are the same definition as $X_1$ to $X_{10}$ provided, however, that at least one of $X_{25}$ to $X_{29}$ is a hydroxyl group and that at least one of $X_{30}$ to $X_{34}$ is a hydroxyl group; and $R_5$ denotes a hydrogen atom or an alkyl group 1 to 4 carbon atoms;

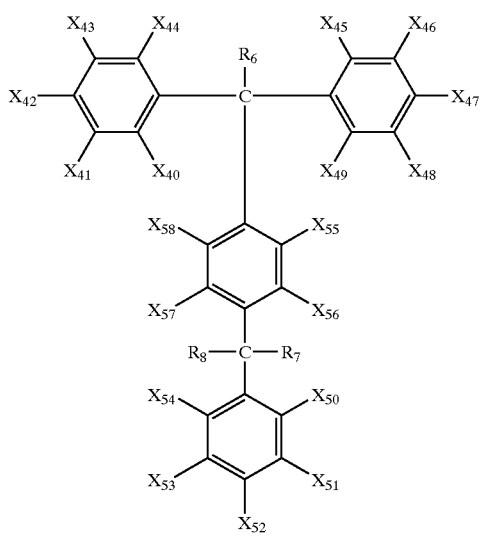

(4)

wherein $X_{40}$ to $X_{58}$, which may be the same or different, are the same definition as $X_1$ to $X_{10}$ provided, however, that at least one of $X_{40}$ to $X_{44}$ is a hydroxyl group, that at least one of $X_{45}$ to $X_{49}$ is a hydroxyl group and that at least one of $X_{50}$ to $X_{54}$ is a hydroxyl group; and $R_6$ to $R_8$ independently denote a hydrogen atom or an alkyl group 1 to 4 carbon atoms;

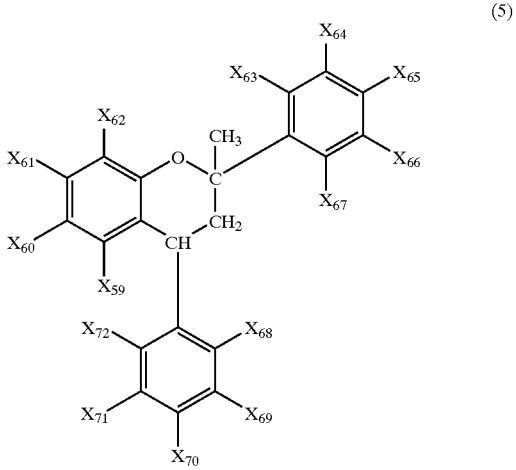

(5)

wherein $X_{59}$ to $X_{72}$, which may be the same or different, are the same definition as $X_1$ to $X_{10}$ provided, however, that at least one of $X_{59}$ to $X_{62}$ is a hydroxyl group and that at least one of $X_{63}$ to $X_{67}$ is a hydroxyl group.

Examples of the quinonediazide compound (C1) include esters of either 1,2-naphthoquinonediazido-4-sulfonic acid or 1,2-naphthoquinonediazido-5-sulfonic acid with any of 4,4'-dihydroxydiphenylmethane, 4,4'-dihydroxydiphenylether, 2,3,4-trihydroxybenzophenone, 2,3,4,4'-tetrahydroxybenzophenone, 2,3,4,2',4'-pentahydroxybenzophenone, tris(4-hydroxyphenyl)methane, tris(4-hydroxyphenyl)ethane, 1,1-bis(4-hydroxyphenyl)-1-phenylethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, and 1,1-bis(4-hydroxyphenyl)-1-[4-{1-(4-hydroxyphenyl)-1-methylethyl}phenyl]ethane.

Desirably, the first photosensitive composition contains the quinonediazide compound (C1) at 10 to 50 parts by mass, and preferably 15 to 30 parts by mass based on 100 parts by mass of the phenolic resin (B1) (or the total amount of the phenolic resin (B1) and the phenolic compound (b1) when they are used in combination). When the proportion of the quinonediazide compound (C1) falls below the lower limit, the retention percentage of layer in non-photoexposed areas may be lowered and the image may not be obtained accurately as designed with a pattern mask. When the proportion of the quinonediazide compound (C1) exceeds the upper limit, the pattern may be deteriorated and the composition may foam during the curing process.

(C2) Compound Containing at Least Two Alkyletherified Amino Groups In Molecule (Curing Agent):

The compound containing at least two alkyletherified amino groups in the molecule (C2) (hereinafter referred to as the "curing agent (C2)") used in the first composition works as a crosslinking agent (curing agent) which reacts with the phenolic resin (B1). Examples of the curing agent (C2) include nitrogen-containing compounds, such as (poly)methylolated melamine, (poly)methylolated glycoluril, (poly)

methylolated benzoguanamine and (poly)methylolated urea, in which all or part of active methylol groups have been alkyletherified. Exemplary alkyl groups include methyl, ethyl, butyl and mixtures thereof. The curing agent may contain an oligomer component resulting from partial self-condensation of the nitrogen-containing compound. Examples of such curing agents include hexamethoxymethylated melamine, hexabutoxymethylated melamine, tetramethoxymethylated glycoluril and tetrabutoxymethylated glycoluril. These curing agents (C2) may be used either singly or in combination of two or more kinds.

Desirably, the first photosensitive composition contains the curing agent (C2) at 1 to 100 parts by weight, and preferably 5 to 50 parts by weight based on 100 parts by weight of the phenolic resin (B1) (or the total amount of the phenolic resin (B1) and the phenolic compound (b1) when they are used in combination). When the proportion of the curing agent (C2) falls below the lower limit, the curing cannot be effected sufficiently to result in lowered dielectric properties of the cured product. Whereas the proportion over the upper limit may lead to deteriorated patterning properties or heat resistance.

(C3) Thermal Acid Generator:

The thermal acid generator (C3) (hereinafter referred to as the "acid generator (C3)") used in the first composition may be any compound that generates an acid when heated at appropriate temperatures, e.g. at 50 to 250° C. Examples thereof include, but not limited thereto, sulfonium salts, diazonium salts, halogen-containing compounds and sulfonate compounds. The generated acid works as a catalyst to accelerate the reaction between the alkylether groups in the curing agent (C2) and the phenolic resin (B1).

Examples of the acid generator (C3) include benzylmethylphenylsulfonium hexafluoroantimonate, benzylmethylphenylsulfonium hexafluorophosphate, benzylmethylphenylsulfonium tetrafluoroborate, benzylmethylphenylsulfonium trifluoromethanesulfonate, benzyl(4-hydroxyphenyl)methylsulfonium hexafluoroantimonate, benzyl(4-hydroxyphenyl)methylsulfonium hexafluorophosphate, benzyl(4-hydroxyphenyl)methylsulfonium tetrafluoroborate, benzyl(4-hydroxyphenyl)methylsulfonium trifluoromethanesulfonate, benzenediazonium hexafluoroantimonate, benzenediazonium hexafluorophosphate, benzenediazonium tetrafluoroborate, benzenediazonium trifluoromethanesulfonate, naphthalenediazonium hexafluoroantimonate, and naphthalenediazonium trifluoromethanesulfonate.

Desirably, the first photosensitive composition contains the acid generator (C3) at 0.1 to 10 parts by weight, and preferably 0.5 to 5 parts by weight based on 100 parts by weight of the phenolic resin (B1) (or the total amount of the phenolic resin (B1) and the phenolic compound (b1) when they are used in combination). When the proportion of the acid generator (C3) falls below the lower limit, the resultant cured product may have poor solvent resistance. Whereas the proportion over the upper limit may result in lowering of electrical insulating properties.

(C4) Crosslinked Fine Particles:

The crosslinked fine particles (C4) to be used in the first composition may be any particles provided that the polymer making up the particles has Tg of not higher than 0° C. Preferably, the crosslinked fine particles are obtained by copolymerizing a crosslinkable monomer (hereinafter referred to as the "crosslinkable monomer") which has at least two unsaturated polymerizable groups with one or more different monomers (hereinafter referred to as the "different monomer(s)") which is selected so that the resultant copolymer for making up the crosslinked fine particles (C4) has Tg of not higher than 0° C. Preferably, the different monomer has a functional group other than polymerizable groups, such as a carboxyl, epoxy, amino, isocyanate or hydroxyl group, and is such that the resulting copolymer for making up the crosslinked fine particles (C4) has Tg of not higher than 0° C.

Exemplary crosslinkable monomers include compounds with plural polymerizable unsaturated groups, such as divinylbenzene, diallyl phthalate, ethylene glycol di(meth)acrylate, propylene glycol di(meth)acrylate, trimethylolpropane tri(meth)acrylate, pentaerythritol tri(meth)acrylate, polyethylene glycol di(meth)acrylate and polypropylene glycol di(meth)acrylate. On these, divinylbenzene is preferable.

In preparing the crosslinked fine particles (C4) for use in the first composition, the crosslinkable monomer is preferably used at 1 to 20% by weight, and more preferably 2 to 10% by weight based on the total amount of all the monomers to be copolymerized.

Examples of the different monomers include:

diene compounds such as butadiene, isoprene, dimethylbutadiene, chloroprene and 1,3-pentadiene;

unsaturated nitrile compounds such as (meth)acrylonitrile, α-chloroacrylonitrile, α-chloromethylacrylonitrile, α-methoxyacrylonitrile, α-ethoxyacrylonitrile, nitrile crotonate, nitrile cinnamate, dinitrile itaconate, dinitrile maleate and dinitrile fumarate;

unsaturated amides such as (meth)acrylamide, N,N'-methylenebis(meth)acrylamide, N,N'-ethylenebis(meth)acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonic amide and cinnamic amide;

(meth)acrylates such as methyl (meth)acrylate, ethyl (meth)acrylate, propyl (meth)acrylate, butyl (meth)acrylate, hexyl (meth)acrylate, lauryl (meth)acrylate, polyethylene glycol (meth)acrylate and polypropylene glycol (meth)acrylate;

aromatic vinyl compounds such as styrene, α-methylstyrene, o-methoxystyrene, p-hydroxystyrene and p-isopropenylphenol;

epoxy (meth)acrylates resulting from the reaction of diglycidyl ether of bisphenol A, diglycidyl ether of glycol, etc. with (meth)acrylic acid, hydroxyalkyl (meth)acrylate, etc.; and urethane (meth)acrylates resulting from the reaction of hydroxyalkyl (meth)acrylate with polyisocyanate;

unsaturated compounds having an epoxy group such as glycidyl (meth)acrylate and (meth)allyl glycidyl ether;

unsaturated acid compounds such as (meth)acrylic acid, itaconic acid, β-(meth)acryloxyethyl succinate, β-(meth)acryloxyethyl maleate, β-(meth)acryloxyethyl phthalate and β-(meth)acryloxyethyl hexahydrophthalate;

unsaturated compounds having an amino group such as dimethylamino (meth)acrylate and diethylamino (meth)acrylate;

unsaturated compounds having an amido group such as (meth)acrylamide and dimethyl (meth)acrylamide; and unsaturated compounds having a hydroxyl group such as hydroxyethyl (meth)acrylate, hydroxypropyl (meth)acrylate and hydroxybutyl (meth)acrylate.

Of these different monomers, butadiene, isoprene, (meth)acrylonitrile, alkyl (meth)acrylates, styrene, p-hydroxystyrene, p-isopropenylphenol, glycidyl (meth)acrylate, (meth)acrylic acid, hydroxyalkyl (meth)acrylates, etc. may be preferably used.

As the different monomer, at least one kind of diene compounds, particularly butadiene, is preferably used. Desirably, the diene compound is used at 20 to 80% by weight, and preferably 30 to 70% by weight based on the total amount of all the monomers to be copolymerized.

The crosslinked fine particles (C4) for use in the first composition can be obtained as rubber-like soft fine particles when the diene compound such as butadiene has been copolymerized in the above proportion based on the total amount of all the monomers. Further, the above amount of the different monomer leads to excellent crack resistance and durability of the resulting cured layer.

Desirably, the crosslinked fine particles (C4) used in the first composition have a mean particle diameter of 30 to 500 nm, preferably 40 to 200 nm, and more preferably 50 to 120 nm. The particle diameters of the crosslinked fine particles (C4) may be controlled by any method. The control method is not limited to the above. In the case where the particles (C4) are synthesized by emulsion polymerization, the particle diameters can be controlled by adjusting the amount of emulsifying agent to regulate the number of micells formed during the emulsion polymerization.

Desirably, the crosslinked fine particles (C4) are used at 0 to 50 parts by weight, preferably 1 to 50 parts by weight, and more preferably 5 to 30 parts by weight based on 100 parts by weight of the phenolic resin (B1) (or the total amount of the phenolic resin (B1) and the phenolic compound (b1) when they are used in combination). When the proportion of the crosslinked fine particles (C4) falls below the lower limit, the resultant cured layer may have poor thermal shock properties. Whereas the proportion over the upper limit may result in deterioration of resolution and heat resistance of the cured layer; further it may cause lowering of compatibility and dispersion properties of the particles with other components. Containment of the crosslinked fine particles enables the photosensitive composition for forming a dielectric to provide a cured layer that has improved thermal shock properties.

(D) Solvent:

The solvent (D) is incorporated in the first composition to improve handling properties or to control the viscosity or storage stability of the composition. Examples of the solvent (D) include, but not particularly limited thereto:

ethylene glycol monoalkylether acetates such as ethylene glycol monomethylether acetate and ethylene glycol monoethylether acetate;

propylene glycol monoalkylethers such as propylene glycol monomethylether, propylene glycol monoethylether, propylene glycol monopropylether and propylene glycol monobutylether;

propylene glycol dialkylethers such as propylene glycol dimethylether, propylene glycol diethylether, propylene glycol dipropylether and propylene glycol dibutylether;

propylene glycol monoalkylether acetates such as propylene glycol monomethylether acetate, propylene glycol monoethylether acetate, propylene glycol monopropylether acetate and propylene glycol monobutylether acetate;

cellosolves such as ethyl cellosolve and butyl cellosolve;

carbitols such as butyl carbitol;

lactates such as methyl lactate, ethyl lactate, n-propyl lactate and isopropyl lactate;

aliphatic carboxylates such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate;

other esters such as methyl 3-methoxypropionate, ethyl 3-methoxypropionate, methyl 3-ethoxypropionate, ethyl 3-ethoxypropionate, methyl pyruvate and ethyl pyruvate;

aromatic hydrocarbons such as toluene and xylene;

ketones such as 2-heptanone, 3-heptanone, 4-heptanone and cyclohexanone;

amides such as N-dimethylformamide, N-methylacetamide, N,N-dimethylacetamide and N-methylpyrrolidone; and lactones such as γ-butyrolactone.

These solvents (D) may be used either singly or in combination of two or more kinds.

(E) Another Additive:

The first photosensitive composition may further contain another additive (E), such as an epoxy compound, an adhesion auxiliary or a leveling agent. Examples of the epoxy compounds include novolak epoxy resins, bisphenol epoxy resins, alicyclic epoxy resins and aliphatic epoxy resins. These additives (E) may be used within limits not detrimental to the characteristics of the composition.

Second Photosensitive Composition for Forming Dielectric

The second photosensitive composition for forming a dielectric comprises:

(A) inorganic particles which comprise inorganic superfine particles (A-I) having a mean particle diameter of less than 0.05 $\mu$m and inorganic fine particles (A-II) having a mean particle diameter of not less than 0.05 $\mu$m;

(B) an alkali developable resin;

(C) an additive which is a photoacid generator (C5); and optionally (D) a solvent and (E) another additive.

The second photosensitive composition can be prepared by kneading these components with a kneader such as a roll mill, a mixer, a homomixer, a ball mill or a bead mill.

This second composition prepared as above is in paste form with a fluidity sufficient for coating applications. Ideally, the viscosity thereof ranges from 10 to 100,000 mPa·s, and preferably from 50 to 10,000 mPa·s. Also desirably, this second photosensitive composition is capable of forming, upon heating at temperatures not higher than 500° C., a dielectric that has a dielectric constant of not less than 20 and a dielectric loss tangent of not more than 0.1.

Hereinafter, each component of the second photosensitive composition will be described.

(A) Inorganic Particles:

The inorganic particles (A) for the second composition should comprise inorganic superfine particles (A-I) having a mean particle diameter of less than 0.05 $\mu$m and inorganic fine particles (A-II) having a mean particle diameter of not less than 0.05 $\mu$m. The inorganic particles used herein may be those used in the first composition when the above conditions are satisfied.

To improve the dispersibility of the inorganic particles (A) in aqueous media, they may be suitably surface-treated with silica, alumina or the like.

Desirably, the second photosensitive composition contains the inorganic superfine particles (A-I) at 1 to 30 parts by mass, and preferably 5 to 20 parts by mass, and the inorganic fine particles (A-II) at 99 to 70 parts by mass, and preferably 95 to 80 parts by mass based on 100 parts by mass of the inorganic particles (A). The use of the above inorganic particles in the above proportion leads to a high packing density of the particles so that the resulting dielectric can have a high dielectric constant.

The mean particle diameter of the inorganic particles, i.e., that of the whole of the inorganic superfine particles (A-I) and the inorganic fine particles (A-II), is preferably between 0.005 and 2.0 μm, more preferably 0.02 and 1.0 μm, still preferably 0.02 and 0.8 μm, and particularly preferably 0.02 and 0.3 μm. Further, the Dw/Dn ratio (Dw: weight-average particle diameter, Dn: number-average particle diameter) is preferably not less than 1.05, more preferably not less than 1.1, still preferably not less than 1.2, and particularly preferably not less than 1.25. With the Dw/Dn ratio being less than 1.05, those dielectric particles will have a low packing density when a dielectric layer is formed thin so that the leakage current may unfavorably increase.

In the second photosensitive composition, the amount of the inorganic particles (A) (total amount of superfine particles (A-I) and fine particles (A-II)) is preferably 20 to 95% by mass, preferably 40 to 90% by mass, and more preferably 60 to 85% by mass on the basis of 100% by mass of the total amount of the components (A), (B) and (C5).

(B) Alkali Developable Resin:

The alkali developable resin (B) used in the second composition has an "alkali developability", which is a property of being dissolved by an alkaline developer. In other words, the alkali developability is understood as an alkali solubility whereby desired development can be accomplished.

Various resins can be used as the alkali developable resin (B) and examples thereof include (meth)acrylic resins, hydroxystyrene resins, novolak resins, polyester resins, polyimide resins, nylon resins and polyetherimide resins. Of these alkali developable resins (B), (meth)acrylic resins are preferable.

Particularly preferred examples thereof include:

copolymers comprising a monomer having a carboxyl group (b2) (hereinafter referred to as "monomer (b2)") and another copolymerizable monomer (b4) (hereinafter referred to as "monomer (b4)"); and copolymers comprising a monomer (b2), a monomer having an epoxy group (b3) (hereinafter referred to as "monomer (b3)") and a monomer (b4).

Examples of the monomer (b2) (monomers having a carboxyl group) include acrylic acid, methacrylic acid, maleic acid, fumaric acid, crotonic acid, itaconic acid, citraconic acid, mesaconic acid, cinnamic acid, mono(2-(meth)acryloyloxyethyl) succinate and ω-carboxypolycaprolactone mono(meth)acrylate.

Examples of the monomer (b3) (monomers having a epoxy group) include glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, N-[4-(2,3-epoxypropoxy)-3,5-dimethylbenzyl] acrylamide and N-[4-(2,3-epoxypropoxy)-3,5-dimethylphenylpropyl] acrylamide.

Examples of the monomer (b4) which is a copolymerizable monomer include:

methyl (meth)acrylate, ethyl (meth)acrylate, n-butyl (meth)acrylate, n-lauryl (meth)acrylate, benzyl (meth)acrylate and dicyclopentanyl (meth)acrylate;

(meth)acrylates other than the monomers (b2) and (b3) (for the copolymers comprising the monomer (b3));

aromatic vinyl monomers such as styrene and α-methylstyrene;

conjugated dienes such as butadiene and isoprene; and macromonomers having a polymerizable unsaturated group, e.g., a (meth)acryloyl group, in one terminal of its polymer chain, such as polystyrene, polymethyl (meth)acrylate, polyethyl (meth)acrylate and polybenzyl (meth)acrylate.

Because of the presence of copolymerized components derived from a monomer having a carboxyl group of the monomers (b2) and/or (b3) or a phenolic hydroxyl group, the copolymers comprising the monomers (b2) and (b4) or those comprising the monomers (b2), (b3) and (b4) have the alkali solubility. In particular, the copolymers comprising the monomers (b2), (b3) and (b4) are preferable from the viewpoints of dispersion stability for the inorganic particles (A) and solubility by an alkaline developer after-mentioned. Preferably, the copolymer contains component units derived from the monomer (b2) at 1 to 50% by mass, and particularly preferably 5 to 30% by mass, and those derived from the monomer (b3) at 1 to 50% by mass, and particularly preferably 5 to 30% by mass, and those derived from the monomer (b4) at 1 to 98% by mass, and particularly preferably 40 to 90% by mass.

The alkali developable resin (B) in the second composition preferably has a mass-average molecular weight in terms of polystyrene as measured by GPC (hereinafter referred to as simply the "mass-average molecular weight (Mw)") of 5,000 to 5,000,000, and more preferably 10,000 to 300,000.

Desirably, the second photosensitive composition contains the alkali developable resin (B) at 1 to 500 parts by mass, preferably 10 to 500 parts by mass, and more preferably 10 to 200 parts by mass based on 100 parts by mass of the inorganic particles (A).

Also desirably, the content of the alkali developable resin (B) in the second composition is 1 to 60% by mass, preferably 2 to 40% by mass, and more preferably 5 to 30% by mass on the basis of 100% by mass of the total amount of the components (A), (B) and (C5).

The second photosensitive composition may contain another resin than the alkali developable resin, such as a bismaleimide resin or an epoxy resin.

(C5) Photoacid Generator:

The photoacid generator (C5) is a compound which generates an acid on exposure to radiation. Examples thereof include 1,2-benzoquinonediazidosulfonic acid esters, 1,2-naphthoquinonediazidosulfonic acid esters, 1,2-benzoquinonediazidosulfonic acid amides and 1,2-naphthoquinonediazidosulfonic acid amides. Specific examples include the 1,2-quinonediazide compounds described in "Light-Sensitive Systems" by J. Kosar, pp. 339–352 (1965) John Wiley & Sons, Inc. (New York) and "Photoresist" by W. S. De Forest p. 50 (1975), McGraw-Hill, Inc. (New York).

Of the above compounds, those exhibiting excellent post-irradiation transparency in the visible light range of 400 to 800 nm are preferable; listed as examples are ester compounds of 1,2-benzoquinonediazido-4-sulfonic acid, 1,2-naphthoquinonediazido-4-sulfonic acid or 1,2-naphthoquinonediazido-5-sulfonic acid with any of 2,3,4-trihydroxybenzophenone, 2,3,4,4'-tetrahydroxybenzophenone, 3'-methoxy-2,3,4,4'-tetrahydroxybenzophenone, 2,2',5,5'-tetramethyl-2',4,4'-trihydroxytriphenylmethane, 4,4'-[1-[4-(1-(4-hydroxyphenyl)-1-methylethyl)phenyl] ethylidene]diphenol and 2,4,4-trimethyl-2',4',7-trihydroxy-2-phenylflavan.

The content of the photoacid generator (C5) is preferably 5 to 100 parts by mass, and particularly preferably 10 to 50 parts by mass based on 100 parts by mass of the alkali developable resin (B). The photoacid generator (C5) in a content below this lower limit generates an acid in too small amount upon absorption of radiation. Therefore, the solubility for an alkaline aqueous solution will not change between before and after the composition has been exposed to radiation. This will result in difficult patterning, and the pattern may have a problem in heat resistance. Whereas the photoacid generator added over the upper limit will remain in a substantial amount if the composition is exposed to radiation only for a short time. Accordingly, the insolubility for an alkaline aqueous solution will become too high and the development may be difficult as a result.

Desirably, the second photosensitive composition contains the photoacid generator (C5) at 0.1 to 30% by mass, preferably 0.5 to 20% by mass, and more preferably 1 to 10% by mass based on 100% by mass of the total amount of the components (A), (B) and (C5).

(D) Solvent:

The second photosensitive composition may optionally contain a solvent (D).

The solvent (D) preferably has the following properties:

it has a good affinity for the inorganic superfine particles (A-I) and the inorganic fine particles (A-II), it has a good solubility for the alkali developable resin (B), the photoacid generator (C5) and an optional additive (E) after-mentioned, it can impart an appropriate viscosity to the second photosensitive composition, and it can be readily evaporated by drying.

Examples of the solvent (D) include:

ketones such as diethyl ketone, methyl butyl ketone, dipropyl ketone and cyclohexanone;

alcohols such as n-pentanol, 4-methyl-2-pentanol, cyclohexanol and diacetone alcohol;

ethereal alcohols such as ethylene glycol monomethyl ether, ethylene glycol monoethyl ether, ethylene glycol monobutyl ether, propylene glycol monomethyl ether and propylene glycol monoethyl ether;

alkyl esters of saturated aliphatic monocarboxylic acids such as n-butyl acetate and amyl acetate;

lactic acid esters such as ethyl lactate and n-butyl lactate; and ether esters such as methyl cellosolve acetate, ethyl cellosolve acetate, propylene glycol monomethyl ether acetate and ethyl-3-ethoxy propionate.

These solvents may be used either singly or in combination of two or more kinds.

The content of the solvent (D) in the second composition can be appropriately determined to obtain a good flowability. Desirably, it is in the range of 1 to 10,000 parts by mass, and preferably 10 to 1,000 parts by mass based on 100 parts by mass of the inorganic particles (A).

(E) Another Additive:

In addition to the above components (A), (B) and (C5), the second photosensitive composition may optionally contain another additive (E). Exemplary additives (E) include a plasticizer, an adhesion auxiliary, a dispersant, a filler, a storage stabilizer, an anti-foaming agent, an antioxidant, an ultraviolet light absorber, a leveling agent and a developing accelerator.

(i) Adhesion Auxiliary:

For use as the adhesion auxiliary, at least one coupling agent can be selected from silane coupling agents, aluminum coupling agents, titanate coupling agents and zirconate coupling agents. Of these, silane coupling agents such as a compound represented by the formula (6) ((alkyl) alkoxysilanes having a saturated alkyl group), which can achieve sufficient adhesion in relatively small amounts, are preferably used.

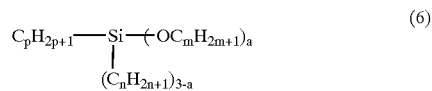

(6)

wherein p is an integer of 3 to 20, m is an integer of 1 to 3, n is an integer of 1 to 3, and a is an integer of 1 to 3.

The indicator p for carbon number in the saturated alkyl group ranges from 3 to 20, and preferably 4 to 16.

Examples of the silane coupling agents of the formula (6) include:

saturated alkyl dimethyl methoxy silanes (a=1, m=1, n=1) such as n-propyl dimethyl methoxy silane, n-butyl dimethyl methoxy silane, n-decyl dimethyl methoxy silane, n-hexadecyl dimethyl methoxy silane and N-eicosane dimethyl methoxy silane;

saturated alkyl diethyl methoxy silanes (a=1, m=1, n=2) such as n-propyl diethyl methoxy silane, n-butyl diethyl methoxy silane, n-decyl diethyl methoxy silane, n-hexadecyl diethyl methoxy silane and n-eicosane diethyl methoxy silane;

saturated alkyl dipropyl methoxy silanes (a=1, m=1, n=3) such as n-butyl dipropyl methoxy silane, n-decyl dipropyl methoxy silane, n-hexadecyl dipropyl methoxy silane and n-eicosane dipropyl methoxy silanes;

saturated alkyl dimethyl ethoxy silanes (a=1, m=2, n=1) such as n-propyl dimethyl ethoxy silane, n-butyl dimethyl ethoxy silane, n-decyl dimethyl ethoxy silane, n-hexadecyl dimethyl ethoxy silane and n-eicosane dimethyl ethoxy silane;

saturated alkyl diethyl ethoxy silanes (a=1, m=2, n=2) such as n-propyl diethyl ethoxy silane, n-butyl diethyl ethoxy silane, n-decyl diethyl ethoxy silane, n-hexadecyl diethyl ethoxy silane and n-eicosane diethyl ethoxy silane;

saturated alkyl dipropyl ethoxy silanes (a=1, m=2, n=3) such as n-butyl dipropyl ethoxy silane, n-decyl dipropyl ethoxy silane, n-hexadecyl dipropyl ethoxy silane and n-eicosane dipropyl ethoxy silane;

saturated alkyl dimethyl propoxy silanes (a=1, m=3, n=1) such as n-propyl dimethyl propoxy silane, n-butyl dimethyl propoxy silane, n-decyl dimethyl propoxy silane, n-hexadecyl dimethyl propoxy silane and n-eicosane dimethyl propoxy silane;

saturated alkyl diethyl propoxy silanes (a=1, m=3, n=2) such as n-propyl diethyl propoxy silane, n-butyl diethyl propoxy silane, n-decyl diethyl propoxy silane, n-hexadecyl diethyl propoxy silane and n-eicosane diethyl propoxy silane;

saturated alkyl dipropyl propoxy silanes (a=1, m=3, n=3) such as n-butyl dipropyl propoxy silane, n-decyl dipropyl propoxy silane, n-hexadecyl dipropyl propoxy silane and n-eicosane dipropyl propoxy silane;

saturated alkyl methyl dimethoxy silanes (a=2, m=1, n=1) such as n-propyl methyl dimethoxy silane, n-butyl methyl dimethoxy silane, n-decyl methyl dimethoxy silane, n-hexadecyl methyl dimethoxy silane and n-eicosane methyl dimethoxy silane;

saturated alkyl ethyl dimethoxy silanes (a=2, m=1, n=2) such as n-propyl ethyl dimethoxy silane, n-butyl ethyl dimethoxy silane, n-decyl ethyl dimethoxy silane, n-hexadecyl ethyl dimethoxy silane and n-eicosane ethyl dimethoxy silane;

saturated alkyl propyl dimethoxy silanes (a=2, m=1, n=3) such as n-butyl propyl dimethoxy silane, n-decyl propyl dimethoxy silane, n-hexadecyl propyl dimethoxy silane and n-eicosane propyl dimethoxy silane;

saturated alkyl methyl diethoxy silanes (a=2, m=2, n=1) such as n-propyl methyl diethoxy silane, n-butyl methyl diethoxy silane, n-decyl methyl diethoxy silane, n-hexadecyl methyl diethoxy silane and n-eicosane methyl diethoxy silane;

saturated alkyl ethyl diethoxy silanes (a=2, m=2, n=2) such as n-propyl ethyl diethoxy silane, n-butyl ethyl diethoxy silane, n-decyl ethyl diethoxy silane, n-hexadecyl ethyl diethoxy silane and n-eicosane ethyl diethoxy silane;

saturated alkyl propyl diethoxy silanes (a=2, m=2, n=3) such as n-butyl propyl diethoxy silane, n-decyl propyl diethoxy silane, n-hexadecyl propyl diethoxy silane and n-eicosane propyl diethoxy silane;

saturated alkyl methyl dipropoxy silanes (a=2, m=3, n=1) such as n-propyl methyl dipropoxy silane, n-butyl methyl dipropoxy silane, n-decyl methyl dipropoxy silane, n-hexadecyl methyl dipropoxy silane and n-eicosane methyl dipropoxy silane;

saturated alkyl ethyl dipropoxy silanes (a=2, m=3, n=2) such as n-propyl ethyl dipropoxy silane, n-butyl ethyl dipropoxy silane, n-decyl ethyl dipropoxy silane, n-hexadecyl ethyl dipropoxy silane and n-eicosane ethyl dipropoxy silane;

saturated alkyl propyl dipropoxy silanes (a=2, m=3, n=3) such as n-butyl propyl dipropoxy silane, n-decyl propyl dipropoxy silane, n-hexadecyl propyl dipropoxy silane and n-eicosane propyl dipropoxy silane;

saturated alkyl trimethoxy silanes (a=3, m=1) such as n-propyl trimethoxy silane, n-butyl trimethoxy silane, n-decyl trimethoxy silane, n-hexadecyl trimethoxy silane and n-eicosane trimethoxy silane;

saturated alkyl triethoxy silanes (a=3, m=2) such as n-propyl triethoxy silane, n-butyl triethoxy silane, n-decyl triethoxy silane, n-hexadecyl triethoxy silane and n-eicosane triethoxy silane; and saturated alkyl tripropoxy silanes (a=3, m=3) such as n-propyl tripropoxy silane, n-butyl tripropoxy silane, n-decyl tripropoxy silane, n-hexadecyl tripropoxy silane and n-eicosane tripropoxy silane.

The above compounds may be used either singly or in combination of two or more kinds.

Of these, particularly preferable are n-butyl trimethoxy silane, n-decyl trimethoxy silane, n-hexadecyl trimethoxy silane, n-decyl dimethyl methoxy silane, n-hexadecyl dimethyl methoxy silane, n-butyl triethoxy silane, n-decyl triethoxy silane, n-hexadecyl triethoxy silane, n-decyl ethyl diethoxy silane, n-hexadecyl ethyl diethoxy silane, n-butyl tripropoxy silane, n-decyl tripropoxy silane and n-hexadecyl tripropoxy silane.

Desirably, the second photosensitive composition contains the adhesion auxiliary at 0.001 to 10 parts by mass, and preferably 0.001 to 5 parts by mass based on 100 parts by mass of the inorganic particles (A).

(ii) Dispersant:

The dispersant used for the inorganic particles (A) is preferably a fatty acid; especially it is a fatty acid of 4 to 30 carbon atoms, preferably 4 to 20 carbon atoms. Exemplary preferable fatty acids include saturated fatty acids such as fumaric acid, phthalic acid, malonic acid, itaconic acid, citraconic acid, octanoic acid, undecylic acid, lauric acid, myristic acid, palmitic acid, pentadecanoic acid, stearic acid and arachidic acid; and unsaturated fatty acids such as elaidic acid, oleic acid, linoleic acid, linolenic acid and arachidonic acid. These may be used either singly or in combination of two or more kinds.

Desirably, the second photosensitive composition contains the dispersant at 0.001 to 10 parts by mass, and preferably 0.01 to 5 parts by mass based on 100 parts by mass of the inorganic particles (A).

(iii) Filler:

The filler used herein has a capability of improving the dielectric constant. Examples thereof include conductive fine particles such as carbon powders (e.g., acetylene black and Ketjen black), graphite powders and higher order fullerene, and semiconductive fine particles such as silicone carbide powders.

Desirably, these fillers for improving the dielectric constant are used at 0 to 10 parts by mass, preferably 0.05 to 3 parts by mass, and particularly preferably 0.1 to 1 part by mass based on 100 parts by mass of the inorganic particles (A).

Third Photosensitive Composition for Forming Dielectric

The third photosensitive composition for forming a dielectric comprises:

(A) inorganic particles which comprise inorganic superfine particles (A-I) having a mean particle diameter of less than 0.05 µm and inorganic fine particles (A-II) having a mean particle diameter of not less than 0.05 µm;

(B) an alkali developable resin which is an alkali soluble resin (B2);

(C) additives which are a compound having an ethylenically unsaturated group (C6) and a photopolymerization initiator (C7); and optionally (D) a solvent and (E) another additive.

This third photosensitive composition can be prepared by kneading these components with a kneader such as a roll mill, a mixer, a homomixer, a ball mill or a bead mill.

The third photosensitive composition thus prepared is in paste form with a fluidity sufficient for coating applications. Ideally, the viscosity thereof ranges from 10 to 100,000 mPa·s, and preferably from 50 to 10,000 mPa·s. Also desirably, this third composition is capable of forming, upon heating at temperatures not higher than 500° C., a dielectric that has a dielectric constant of not less than 20 and a dielectric loss tangent of not more than 0.1.

Hereinafter, each component of the third photosensitive composition will be described.

(A) Inorganic Particles:

The inorganic particles (A) for the third composition should comprise inorganic superfine particles (A-I) having a mean particle diameter of less than 0.05 µm and inorganic fine particles (A-II) having a mean particle diameter of not less than 0.05 µm. The inorganic particles used herein may be those used in the second composition when the above conditions are satisfied.

Desirably, the third photosensitive composition contains the inorganic superfine particles (A-I) at 1 to 30 parts by mass, and preferably 5 to 20 parts by mass, and the inorganic fine particles (A-II) at 99 to 70 parts by mass, and preferably 95 to 80 parts by mass on the basis of 100 parts by mass of the inorganic particles (A). The use of the above inorganic particles in the above proportion leads to a high packing density of the particles so that the resulting dielectric can have a high dielectric constant.

The mean particle diameter of all the inorganic particles, i.e., that of the whole of the inorganic superfine particles (A-I) and the inorganic fine particles (A-II), is preferably between 0.005 and 2.0 μm, more preferably 0.02 and 1.0 μm, still preferably 0.02 and 0.8 μm and particularly preferably 0.02 and 0.3 μm. Further, the Dw/Dn ratio (Dw: weight-average particle diameter, Dn: number-average particle diameter) is preferably not less than 1.05, more preferably not less than 1.1, still preferably not less than 1.2, and particularly preferably not less than 1.25. With the Dw/Dn ratio being less than 1.05, those dielectric particles will have a low packing density when a dielectric layer is formed thin so that the leakage current may unfavorably increase.

In the third composition, the amount of the inorganic particles (A) (total amount of superfine particles (A-I) and fine particles (A-II)) is preferably 20 to 95% by mass, preferably 45 to 90% by mass, and more preferably 55 to 85% by mass based on 100% by mass of the total amount of the components (A), (B2), (C6) and (C7).

(B2) Alkali Soluble Resin:

The alkali soluble resin (B2) used in the third photosensitive composition has an "alkali developability", which is a property of being dissolved by an alkaline developer. In other words, the alkali developability is understood as an alkali solubility whereby desired development can be accomplished.

Various resins can be used as the alkali soluble resin (B2) and examples thereof include (meth)acrylic resins, hydroxystyrene resins, novolak resins and polyester resins.

Of these alkali soluble resins (B2), (meth)acrylic resins are preferable.

Particularly preferred examples thereof include:

copolymers comprising a monomer having a carboxyl group (b2) (hereinafter referred to as "monomer (b2)") and another copolymerizable monomer (b4) (hereinafter referred to as "monomer (b4)"); and copolymers comprising a monomer (b2), a monomer having an OH group (b5) (hereinafter referred to as "monomer (b5)") and a monomer (b4).

Examples of the monomer (b2) (monomers having a carboxyl group) include those listed with respect to the second photosensitive composition.

Examples of the monomer (b5) (monomers having an OH group) include monomers having a hydroxyl group such as 2-hydroxyethyl (meth)acrylate, 2-hydroxypropyl (meth)acrylate and 3-hydroxypropyl (meth)acrylate; and phenolic hydroxyl group-containing monomers such as o-hydroxystyrene, m-hydroxystyrene and p-hydroxystyrene.

Of these, the monomers having a hydroxyl group such as 2-hydroxyethyl (meth)acrylate, 2-hydroxypropyl (meth)acrylate and 3-hydroxypropyl (meth)acrylate are preferred.

Examples of the monomer (b4) (copolymerizable monomers) include those listed with respect to the second photosensitive composition.

Because of the presence of copolymerized components derived from a monomer having a carboxyl group of the monomers (b2) and/or (b5) or a phenolic hydroxyl group, the copolymers comprising the monomers (b2) and (b4) or those comprising the monomers (b2), (b4) and (b5) have the alkali solubility. In particular, the copolymers comprising the monomers (b2), (b4) and (b5) are preferable from the viewpoints of dispersion stability for the inorganic particles (A) and solubility by the alkaline developer after-mentioned.

Preferably, the copolymer contains component units derived from the monomer (b2) at 1 to 50% by mass, and particularly preferably 5 to 30% by mass, and those derived from the monomer (b5) at 1 to 50% by mass, and particularly preferably 5 to 30% by mass, and those derived from the monomer (b4) at 1 to 98% by mass, and particularly preferably 40 to 90% by mass.

The alkali soluble resin (B2) for use in the third composition preferably has a mass-average molecular weight in terms of polystyrene as measured by GPC (hereinafter referred to as the "mass-average molecular weight (Mw)") of 5,000 to 5,000,000, and more preferably 10,000 to 300,000.

Desirably, the third photosensitive composition contains the alkali soluble resin (B2) at 1 to 500 parts by mass, preferably 10 to 500 parts by mass, and more preferably 10 to 200 parts by mass based on 100 parts by weight of the inorganic particles (A).

Also desirably, the content of the alkali soluble resin (B2) in the third composition is 1 to 60% by mass, preferably 2 to 30% by mass, and more preferably 5 to 30% by mass based on 100% by mass of the total amount of the components (A), (B2), (C6) and (C7).

The third photosensitive composition may contain another resin than the alkali soluble resin. Examples thereof include polyimide resins, bismaleimide resins and epoxy resins.

(C6) Ethylenically Unsaturated Group-Containing Compound:

The ethylenically unsaturated group-containing compound (C6) for the third composition is not particularly limited as far as it contains an ethylenically unsaturated group and can be induced to undergo radical polymerization by the action of a photopolymerization initiator (C7) as described later. However, a (meth)acrylate compound is generally used.

Examples of the (meth)acrylate compounds include:

di(meth)acrylates of alkylene glycols, such as of ethylene glycol and propylene glycol;

di(meth)acrylates of polyalkylene glycols, such as of polyethylene glycol and polypropylene glycol;

di(meth)acrylates of polymers hydroxylated in both terminals, such as of polybutadiene hydroxylated in both terminals, polyisoprene hydroxylated in both terminals and polycaprolactone hydroxylated in both terminals;

poly(meth)acrylates of polyvalent alcohols of 3 or more valencies such as of glycerol, 1,2,4-butanetriol, trimethylolalkane, tetramethylolalkane, pentaerythritol and dipentaerythritol;

poly(meth)acrylates of polyalkylene glycol adducts of polyvalent alcohols of 3 or more valencies;

poly(meth)acrylates of cyclic polyols, such as of 1,4-cyclohexanediol and 1,4-benzenediol; and oligo-(meth)acrylates, such as polyester (meth)acrylate, epoxy (meth)acrylate, urethane (meth)acrylate, alkyd resin (meth)acrylate, silicone resin (meth)acrylate and spiran resin (meth)acrylate.

Exemplary (meth)acrylate compounds further include the compounds listed above as the monomers (b2), (b4) and (b5) for making up the alkali soluble resin (B2).

The compound having an ethylenically unsaturated group (C6), which includes these (meth)acrylate compounds, may be used either singly or in combination of two or more kinds. The amount of the compound (C6) is usually 20 to 500 parts by mass, preferably 20 to 480 parts by mass, and more preferably 40 to 250 parts by mass based on 100 parts by mass of the alkali soluble resin (B2).

Also desirably, the content of the compound having an ethylenically unsaturated group (C6) in the third composition is 0.1 to 30% by mass, preferably 2 to 20% by mass, and more preferably 5 to 15% by mass based on 100% by mass of the total amount of the components (A), (B2), (C6) and (C7).

(C7) Photopolymerization Initiator:

The photopolymerization initiator (C7) used in the third composition generates radicals upon photoexposure as described hereinbelow to initiate polymerization of the compound having an ethylenically unsaturated group (C6). The photopolymerization initiator is not particularly limited as far as it satisfies the above conditions.

Examples of the photopolymerization initiator (C7) include:

carbonyl compounds such as benzyl, benzoin, benzophenone, Michler's ketone, 4,4'-bisdiethylaminobenzophenone, camphorquinone, 2-hydroxy-2-methyl-1-phenylpropane-1-one, 1-hydroxycyclohexylphenylketone, 2,2-dimethoxy-2-phenylacetophenone, 2-methyl-[4'-(methylthio)phenyl]-2-morpholino-1-propane, 2-benzyl-2-dimethylamino-1-(4-morpholinophenyl)-butane-1-one, 2,4-diethylthioxanthone and isopropylthioxanthone;

phosphine oxide compounds such as bis(2,6-dimethoxybenzoyl)-2,4,4-trimethylpentylphosphine oxide and bis(2,4,6-trimethylbenzoyl)-phenylphosphine oxide;

azo or azide compounds such as azoisobutyronitrile and 4-azidobenzaldehyde;

organosulfur compounds such as mercaptan disulfide;

organic peroxides such as benzoyl peroxide, di-tert-butyl peroxide, tert-butyl hydroperoxide, cumene hydroperoxide and paramethane hydroperoxide;

trihalomethanes such as 2,4-bis(trichloromethyl)-6(2'-chlorophenyl)-1,3,5-triadine and 2-[2-(2-furanyl)ethylenyl]-4,6-bis(trichloromethyl)-1,3,5-triadine; and imidazol dimers such as 2,2'-bis(2-chlorophenyl)-4,5,4',5'-tetraphenyl-1,2'-biimidazol.

These may be used either singly or in combination of two or more kinds. The photopolymerization initiator (C7) may be used together with a sensitizer, a sensitizing auxiliary, a hydrogen donor or a chain transfer agent.

Desirably, the content of the photopolymerization initiator (C7) is 0.1 to 200 parts by mass, and preferably 1 to 50 parts by mass based on 100 parts by mass of the total amount of the components (B2) and (C6).

Also desirably, the third photosensitive composition contains the photopolymerization initiator (C7) at 0.1 to 20% by mass, preferably 0.2 to 5% by mass, and more preferably 0.3 to 3% by mass based on 100% by mass of the total amount of the components (A), (B2), (C6) and (C7).

(D) Solvent:

The third photosensitive composition may optionally contain a solvent (D).

The solvent (D) preferably has the following properties:

it has a good affinity for the inorganic superfine particles (A-I) and the inorganic fine particles (A-II), it has a good solubility for the alkali soluble resin (B2), the compound having an ethylenically unsaturated group (C6), the photopolymerization initiator (C7) and a later-mentioned optional additive (E), it can impart an appropriate viscosity to the third photosensitive composition, and it can be readily evaporated by drying.

Examples of the solvent (D) include those listed with respect to the second composition. Those solvents may be used either singly or in combination of two or more kinds.

The content of the solvent (D) in the third composition can be appropriately determined to obtain an good flowability. Desirably, it is in the range of 1 to 10,000 parts by mass, and preferably 10 to 1,000 parts by mass based on 100 parts by mass of the inorganic particles (A).

(E) Another Additive:

In addition to the above components (A), (B2), (C6) and (C7), the third photosensitive composition may optionally contain another additive (E). Examples thereof include a plasticizer, an adhesion auxiliary, a dispersant, a filler, a storage stabilizer, an anti-foaming agent, an antioxidant, an ultraviolet light absorber, a leveling agent and a developing accelerator.

(i) Adhesion Auxiliary:

The adhesion auxiliary used in the third composition can be exemplified with the same compounds listed with respect to the second composition. Desirably, the third composition contains the adhesion auxiliary at 0.001 to 10 parts by mass, and preferably 0.001 to 5 parts by mass based on 100 parts by mass of the inorganic particles (A).

(ii) Dispersant:

The dispersant used for the inorganic particles (A) in the third composition can be exemplified with the same compounds listed with respect to the second composition. Desirably, the third composition contains the dispersant at 0.001 to 10 parts by mass, and preferably 0.01 to 5 parts by mass based on 100 parts by mass of the inorganic particles (A).

(iii) Filler:

The filler used in the third composition can be exemplified with the same compounds listed with respect to the second composition. Desirably, the third composition contains the filler at 0 to 10 parts by mass, preferably 0.05 to 3 parts by mass, and particularly preferably 0.1 to 1 part by mass based on 100 parts by mass of the inorganic particles (A).

Photosensitive Transfer Film

The photosensitive transfer film according to the invention can be obtained by applying the aforesaid second photosensitive composition onto a substrate film to form a photosensitive transfer layer on the substrate film. The photosensitive transfer layer may be overlaid with a protective film.

(Substrate Film and Protective Film)

The substrate film of the photosensitive transfer film is preferably a resin film with heat and solvent resistances and also flexibility. A conductive foil is also preferable. The flexibility of the substrate film allows for application of the pasty composition with use of a roll coater to form a photosensitive transfer layer. Further, it enables storage and supply of the rolled photosensitive transfer layer.

The substrate film consisting of a conductive foil is employable as follows:

a dielectric layer which have been applied on the conductive foil is adhered to another substrate, and then the conductive foil is patterned with use of another dry film photoresist (DFR). The patterned conductive foil is used as a photomask in exposing the dielectric layer. Further, the patterned conductive foil can be used as a upper electrode for the dielectric layer.

Exemplary resins for making the substrate film include polyethylene terephthalates, polyesters, polyethylenes, polypropylenes, polystyrenes, polyimides, polyvinyl alcohols, fluorine-containing resins (such as polyfluoroethylene), nylons and celluloses. The substrate film desirably ranges in thickness from 20 to 100 µm, and preferably from 25 to 50 µm from the viewpoint of strength and the like. It is preferable that a surface of the substrate resin film has been release-treated. The release treatment enables easy release of the substrate film when forming a pattern according to the method described hereinbelow. For example, the release treatment can be suitably accomplished by application of a release agent such as a silicon release agent, a fluorine release agent or a silicon-fluorine release agent.

Exemplary conductive foils employable as the substrate film include those comprising copper, gold, silver, platinum, nickel, stainless steel, aluminum, iron or various alloys. From the viewpoint of oxidation resistance, conductivity and flexibility, the foil comprising copper, gold, silver, platinum, nickel or aluminum are particularly preferable. The conductive substrate foil may be a laminate of plural conductive foils or a laminate of the conductive foil and either a resin substrate or a substrate given by impregnating a nonwoven with a resin. Desirably, the conductive foil has a thickness of, but not particularly limited thereto, 5 to 75 µm, preferably 8 to 50 µm, and particularly preferably 10 to 25 µm.

The protective film may comprise the same material as that of the substrate film. A surface of the protective film also is release-treated. The peeling strength with respect to the protective film and the photosensitive transfer layer should be lower than that with respect to the substrate film and the photosensitive transfer layer.

(Photosensitive Transfer Layer)

The photosensitive transfer layer of the photosensitive transfer film can be prepared by applying the above photosensitive composition on the substrate film and drying the applied composition to partially or completely remove the solvent.

To obtain the photosensitive transfer layer as described above, the aforesaid composition is preferably applied on the substrate film by a method capable of effectively forming a uniform and thick layer (for example not less than 1 µm). Exemplary preferred coating methods include the use of a roll coater, a blade coater, a slit coater, a curtain coater and a wire coater.

In respect to the drying conditions, the drying temperature and time may range from 50 to 150° C. and from about 0.5 to 30 minutes, respectively. Desirably, the amount of residual solvent (with respect to the dried photosensitive transfer layer) will be not more than 2% by mass, and preferably not more than 1% by mass.

The photosensitive transfer layer is thus formed on at least one surface of the substrate film. Desirably, the transfer layer has a thickness of 1 to 100 µm, preferably 3 to 70 µm, and more preferably 5 to 50 µm.

Also desirably, the photosensitive transfer layer contains the inorganic particles (A) at 30 to 90% by mass, and preferably 40 to 80% by mass based on the amount of the transfer layer. The photosensitive film has the photosensitive transfer layer described above and has excellent adhesion to an objective substrate and can be formed into a pattern with high dimensional precision.

Dielectric

The aforesaid photosensitive compositions can form a dielectric by heating at 500° C. or below. This dielectric has a dielectric constant of not less than 5 and a dielectric loss tangent of not more than 0.1. In particular, the first photosensitive composition can be heated at 500° C. or below to form a dielectric that has a dielectric constant of not less than 5, preferably not less than 10, a dielectric loss tangent of not more than 0.1, and an electrostatic capacity of not less than 5 $nF/cm^2$. The second or third photosensitive composition or the photosensitive transfer film, when heated at 500° C. or below, provides a dielectric that has a dielectric constant of not less than 20 and a dielectric loss tangent of not more than 0.1.

Preparation methods and properties of these dielectrics will be described hereinbelow.

Dielectric Prepared from First Photosensitive Composition (Method of Forming a Dielectric Pattern)

The method for forming a dielectric pattern from the first photosensitive composition comprises the steps of (1) applying the composition, (2) photoexposing the resultant dielectric layer, (3) developing the dielectric layer, and (4) curing the dielectric pattern.

(1) Step of Applying the Photosensitive Composition:

In this step, the first composition is applied onto a substrate such as a silicon wafer on which wiring patterns have been provided. Then the applied composition is dried to evaporate the solvent, etc to form a coating layer. This application may be accomplished by, for example, dip coating, spray coating, bar coating, roll coating, spin coating, curtain coating or screen printing. The thickness of the coating layer can be controlled appropriately by selecting the application method and adjusting the solid concentration or viscosity of the composition.

The above substrate is not particularly limited. For example, it may be a plate such as a printed-wiring board, a copper-clad laminate (CCL), an SUS substrate, a copper-foiled polyimide substrate, a ceramic substrate, a silicon wafer (e.g., W-CSP) or an alumina substrate.

(2) Step of Photoexposing the Dielectric Layer:

The dielectric layer obtained by the above application step is selectively irradiated with (exposed to) radiation through a desired pattern mask. Thus, a latent pattern image can be formed on the dielectric layer.

Exemplary radiations employable for the above exposure include an ultraviolet ray, an electron beam and a laser beam emitted from a low-pressure mercury lamp, a high-pressure mercury lamp, a metal halide lamp, a g-line stepper and an i-line stepper. The dose can be appropriately determined in accordance with the radiation source used or the thickness of the dielectric layer. In the case of ultraviolet rays radiated from high-pressure mercury lamps, the dose is about 1,000 to 20,000 $J/m^2$ for the dielectric layer thickness of 0.5 to 50 µm.

(3) Step of Developing the Dielectric Layer:

The photoexposed dielectric layer is subjected to development in which a photoexposed area is dissolved with an alkaline developer and washed away. Thus, a coating layer in desired pattern can be obtained.

Since the inorganic particles (A) have been uniformly dispersed in the phenolic resin (B1), it is naturally understood that when the dielectric layer is developed by dissolving and washing away the binder phenolic resin (B1), the inorganic particles (A) present in the dissolved area will also be removed at the same time. Exemplary developing methods include shower development, spray development, immersion development and puddle development. The development is usually carried out at 20 to 40° C. for about 1 to 10 minutes.

Examples of the alkaline developer include alkaline aqueous solutions of about 0.1 to 10% by mass of an alkaline compound, such as of sodium hydroxide, potassium hydroxide, ammonia water, tetramethylammonium hydroxide or choline. The alkaline aqueous solution may be mixed with an appropriate amount of water-soluble organic solvent, such as methanol or ethanol, or a surfactant. The above development with the alkaline developer is followed by water washing and drying.

(4) Step of Curing the Dielectric Pattern:

In order to impart a function as an electrical condenser, the developed pattern is then cured by heat treatment to give a cured layer. On heating, the acid generator (C3) is decomposed to generate an acid. The catalysis of this acid accelerates a curing reaction between the curing agent (C2) and the phenolic resin (B1). The curing conditions are not particularly limited and depend on the objective use of cured product; for example the coating layer may be cured by heating at 100 to 250° C. for 30 minutes to 10 hours. It is also possible to carry out the heat treatment in two stages in order to effect the curing sufficiently or to avoid deformation of the resulting pattern. For example, the curing can be carried out in a manner such that the dielectric pattern is heated at 50 to 100° C. for 10 minutes to 2 hours in the first stage and further at 100 to 250° C. for 20 minutes to 8 hours in the second stage. With the above curing conditions, the heating can be conducted by a conventional oven, an infrared oven or the like.

(Properties of the Dielectric)

The dielectric prepared from the first composition desirably has a dielectric constant of not less than 5, preferably not less than 10, and more preferably not less than 15. The upper limit of the dielectric constant is not particularly limited. That is, there is no problem for the dielectric constant to be about 200.

Also, the dielectric obtained from the first composition desirably has a dielectric loss tangent of not more than 0.1, preferably not more than 0.08, and still preferably not more than 0.06. The lower limit of the dielectric loss tangent is not particularly limited. That is, there is no problem for the dielectric loss tangent to be about 0.001.

Further, the dielectric produced from the first composition desirably has an electrostatic capacity of not less than 5 $nF/cm^2$, preferably not less than 10 $nF/cm^2$, and more preferably not less than 15 $nF/cm^2$. The upper limit of the electrostatic capacity is not particularly limited. That is, there is no problem for the electrostatic capacity to be about 50 $nF/cm^2$ or more.

The dielectric constant, dielectric loss tangent and electrostatic capacity as used in the present specification are measured by the methods described in JIS K6481 (at 1 MHz frequency).

To be used as an electrical condenser, the above dielectric preferably has a leakage current of not more than $10^{-8}$ $A/cm^2$, still preferably not more than $10^{-9}$ $A/cm^2$, and even preferably not more than $10^{-10}$ $A/cm^2$.

Preferably, the dielectric has a thickness of not more than 50 $\mu$m, still preferably not more than 20 $\mu$m, and even preferably not more than 5 $\mu$m. The lower limit of the thickness is not particularly limited, but the thickness is usually not less than 0.5 $\mu$m.

Dielectric Prepared from Second or Third Photosensitive Composition (Method of Forming a Dielectric Pattern)

The method for forming a dielectric pattern from the second or third photosensitive composition comprises the steps of either (1-1) applying the composition or (1-2) transferring the photosensitive transfer layer, and (2) photoexposing the resultant dielectric layer, (3) developing the dielectric layer, and (4) curing the dielectric pattern.

(1-1) Step of Applying the Photosensitive Composition:

In this step, the second or third composition is applied by a coater onto a substrate to form a dielectric layer. Exemplary preferred coaters include a spinner, a screen printer, a gravure coater, a roll coater, a bar coater and a die coater.

The substrate to be coated with the second composition is not particularly limited. For example, it may be a plate such as a printed-wiring board, a copper-clad laminate (CCL), an SUS substrate, a copper-foiled polyimide substrate, a ceramic substrate, a silicon wafer (e.g., W-CSP) or an alumina substrate. The substrate used in the case of the third composition may be a plate substrate comprising, but not particularly limited thereto, a printed-wiring board, a silicon wafer (e.g., W-CSP), a glass substrate or an alumina substrate.

Specifically, the second or third photosensitive composition is printed on the substrate, e.g., printed-wiring board, with a screen printer etc. and thereafter dried in an oven or the like to form a dielectric layer.

(1-2) Step of Transferring the Photosensitive Transfer Layer:

In this step, the photosensitive transfer layer of the photosensitive transfer film is transferred on a substrate.

The substrate used herein may be a plate substrate of the same kind as the one coated with the second composition. It is permissible that a desired pattern has been formed on the surface of the plate substrate. When required, the surface of the substrate may be pretreated by chemical treatment with a silane coupling agent or the like, plasma treatment, or thin-film forming treatment by ion plating, sputtering, vapor phase reaction or vacuum deposition.

An exemplary transfer process is given below:

when the protective film has been provided due to need, the film is peeled from the photosensitive transfer film;

the photosensitive transfer film is superposed on the substrate so that the transfer layer will be in contact with the substrate; and the photosensitive transfer film is thermocompression bonded with the substrate by means of a heating roller or the like.

By this process, the photosensitive transfer layer is transferred on the substrate and adheres thereto.

The transferring conditions are such that the heating roller has a surface temperature of 20 to 140° C., a rolling pressure of 1 to 5 $kg/cm^2$, and a traveling speed of 0.1 to 10.0 m/min. It is possible that the substrate has been preheated, for example at 40 to 100° C.

(2) Step of Photoexposing the Dielectric Layer:

The dielectric layer obtained as above is irradiated with (exposed to) radiation through a photomask in a selected area. Thus, a latent pattern image can be formed on the dielectric layer.

When the dielectric layer is produced from the second photosensitive composition, a conductive foil may be provided on the dielectric layer during the production. This dielectric layer with conductive foil may be prepared by either laminating a conductive foil with a DFR on the dielectric layer obtained in the aforesaid step (1-1) or by using a conductive foil as the substrate film in the aforesaid step (1-2). This laminate is then subjected to chemical etching of the conductive foil along a previously made pattern. The resultant conductive foil pattern may be used as the above photomask.

Exemplary radiations employable for the above selective irradiation (exposure) include a visible ray, an ultraviolet ray, a far infrared ray, an electron beam and a X-ray. Of these, a visible ray, an ultraviolet ray and a far infrared ray are preferable; an ultraviolet ray is more preferably used.

The photomask has open square dots ranging from 10 to 1000 $\mu$m, but the exposure pattern may differ depending on the object.

The irradiation equipment may be, but not particularly limited to, an ultraviolet irradiation equipment used in the photolithography process or an aligner used in the production of semiconductors and liquid crystal displays.

(3) Step of Developing the Dielectric Layer:

The photoexposed dielectric layer is then developed to elicit the pattern (latent image) in the dielectric layer.

The developer used in this development can be an alkaline developer. By the use thereof, the alkali-developable resin (B) contained in the dielectric layer can be readily dissolved and washed away.

Since the inorganic superfine particles (A-I) and the inorganic fine particles (A-II) have been uniformly dispersed in the alkali developable resin (B), it is naturally understood that when the dielectric layer is developed by dissolving and washing away the alkali-developable binder resin (B), the particles (A-I) and (A-II) present in the dissolved area will also be removed at the same time.

Exemplary active ingredients of the alkaline developer include:

inorganic alkaline compounds such as lithium hydroxide, sodium hydroxide, potassium hydroxide, sodium hydrogen phosphate, diammonium hydrogen phosphate, dipotassium hydrogen phosphate, disodium hydrogen phosphate, ammonium dihydrogen phosphate, potassium dihydrogen phosphate, sodium dihydrogen phosphate, lithium silicate, sodium silicate, potassium silicate, lithium carbonate, sodium carbonate, potassium carbonate, lithium borate, sodium borate, potassium borate and ammonia; and organic alkaline compounds such as tetramethylammonium hydroxide, trimethylhydroxyethylammonium hydroxide, monomethylamine, dimethylamine, trimethylamine, monoethylamine, diethylamine, triethylamine, monoisopropylamine, diisopropylamine and ethanolamine.

The alkaline developer for use in the above development can be prepared by dissolving at least one of these alkaline compounds in a solvent such as water. The concentration of the alkaline compound(s) in the alkaline developer is usually 0.001 to 10% by mass, and preferably 0.01 to 5% by mass. The alkaline developer may contain an additive such as a nonionic surfactant or an organic solvent.

The above development with the alkaline developer will be usually followed by water washing. According to necessity, undesired residues left on the sidewalls of the patterned dielectric layer or on the uncoated area of substrate may be rubbed off by a separate step.

With respect to the development conditions, the kind, composition and concentration of the developer; the development time, temperature and method (such as immersion development, rocking development, shower development, spray development or puddle development); and the development apparatus may be selected appropriately depending on purpose.

By the above development, a dielectric pattern consisting of removed and remaining portions of the dielectric layer can be formed as designed by the photomask.

(4) Step of Curing the Dielectric Pattern:

The dielectric pattern is subjected to a heat treatment and the pattern is cured. This thermal curing can be accomplished by heating at temperatures not higher than 500° C., preferably from 100 to 500° C., and more preferably from 150 to 300° C. The heating time is preferably 1 minute to 24 hours, and more preferably 10 minutes to 12 hours.

Exemplary heating means for thermally curing the second or third composition include an oven, an infrared oven and a hot plate.

(Properties of the Dielectric)

The dielectric prepared from the second or third composition or from the photosensitive transfer film desirably has a dielectric constant of not less than 20, preferably not less than 23, more preferably not less than 25, and particularly preferably not less than 30. The upper limit of the dielectric constant is not particularly limited. That is, there is no problem for the dielectric constant to be about 200.

The dielectric obtained from the second or third composition or from the photosensitive transfer film desirably has a dielectric loss tangent of not more than 0.1, preferably not more than 0.08, and still preferably not more than 0.06. The lower limit of the dielectric loss tangent is not particularly limited. That is, there is no problem for the dielectric loss tangent to be about 0.001.

The dielectric constant and dielectric loss tangent as used in the present specification are measured by the methods described in JIS K6481 (at 1 MHz frequency).

To be used as an electrical condenser, the above dielectric preferably has a leakage current of not more than $10^{-9}$ A/cm$^2$, still preferably not more than $10^{-10}$ A/cm$^2$, and even preferably not more than $10^{-11}$ A/cm$^2$.

Preferably, the dielectric has a thickness of not more than 20 $\mu$m, and still preferably not more than 10 $\mu$m. The lower limit of the thickness is not particularly limited, but the thickness is usually not less than 1 $\mu$m.

Electronic Parts

The first photosensitive composition can be calcined at low temperatures not higher than 500° C. to form the dielectric, and the resultant dielectric has a dielectric constant of not less than 5, a dielectric loss tangent of not more than 0.1 and an electrostatic capacity of not less than 4 nF/cm$^2$. Further, the second or third photosensitive composition or the photosensitive transfer film can be calcined at low temperatures not higher than 500° C. to form the dielectric, and the resultant dielectric has a dielectric constant of not less than 20 and a dielectric loss tangent of not more than 0.1. Therefore, electronic parts, such as an electrical condenser that is thin and has a large electrostatic capacity, are produced from the above dielectric. Moreover, the dielectric according to the invention allows for miniaturization and high-densification of electronic parts such as a printed circuit board, a semiconductor package, an electrical condenser and a high-frequency antenna.

INDUSTRIAL APPLICABILITY

The photosensitive compositions of the invention can form, upon heating at low temperatures of 500° C. or below, a dielectric that has a dielectric constant of not less than 5 and a dielectric loss tangent of not more than 0.1. The first photosensitive composition can be heated at low temperatures not higher than 500° C. to produce a dielectric that has a dielectric loss tangent of not more than 0.1 and a high electrostatic capacity of not less than 5 $nF/cm^2$. The second or third photosensitive composition or the photosensitive transfer film can form, upon heating at low temperatures of 500° C. or below, a dielectric that has a low dielectric loss tangent of not more than 0.1 and a high dielectric constant of not less than 20.

The dielectric of the invention is thin and has a high dielectric constant, so that it can be suitably used in electronic parts such as a printed wiring board, a semiconductor package, an electrical condenser and a high-frequency antenna.

The electronic parts of the invention can be fabricated small and thinly by the use of the above dielectric.

EXAMPLES

The present invention will be hereinafter described in detail by the following Examples, but it should be construed that the invention is in no way limited to those Examples. Hereinafter, "parts" and "%" are by mass unless otherwise mentioned.

The mass-average molecular weight (Mw) is in terms of polystyrene measured by a gel permeation chromatography (GPC) using a chromatograph HLC-802A (available from TOSOH CORPORATION).

Patterning properties and dielectric properties of the dielectric patterns were evaluated as follows.

(Patterning Properties)

In each Example and Comparative Example, measurements were carried out for the width and height of the obtained dielectric pattern with a scanning electron microscope (SEM) to evaluate the accuracy of pattern width as "AA" for the width of 500±10 μm and "BB" for others. Also, deletion of pattern was visually evaluated as "AA" for non-deletion and "BB" for deletion.

(Dielectric Constant, Dielectric Loss Tangent and Leakage Current)

Preparation of Electrode:

In Examples 1–10 and Comparative Examples 1–6, the dielectric pattern obtained was aluminized to form an upper electrode (thickness: 0.5 μm) on the dielectric pattern. In Examples 11–13 and Comparative Example 7, copper-foiled dielectric patterns were afforded to use the copper foil on the pattern as an upper electrode. In Examples 14–17 and Reference Examples 1–2, the dielectric pattern obtained was aluminized to form an electrode having a guide ring (area: 1 $cm^2$, thickness: 0.1 μm).

Measurements of Dielectric Constant and Dielectric Loss Tangent:

The dielectric constant and the dielectric loss tangent were measured at 1 MHz by an LCR meter (HP4284A available from Hewlett-Packard Company). The above measurements were carried out with respect to 10 measurement points between the copper foiled side and the upper electrode of the printed wiring board or silicon wafer substrate. The obtained values were averaged to determine the dielectric constant and the dielectric loss tangent.

Measurement of Leakage Current:

The leakage current was measured with respect to 10 measurement points between the copper foiled side and the electrode with the use of an insulation resistance tester (a product of Advantest Corporation). The obtained values were averaged to determine the leakage current.

(Moist Heat Resistance (HAST test))

The cured films were subjected to a 72-hour moist heat resistance test at 121° C. and 100% humidity under 2 atm. The films given before and after the test were individually analyzed by an infrared spectrophotometry. The results were compared with each other to evaluate the moist heat resistance according to the following criteria.

AA: no difference observed, showing good moist heat resistance

BB: drastic difference observed, showing poor moist heat resistance

First Photosensitive Composition for Forming Dielectric

The following is a list of the components used in Examples 1–5 and Comparative Examples 1–5.

Inorganic Particles (A):

A-1: barium titanate particles (trade name: BT-01 available from Sakai Chemicals Co., Ltd., mean particle diameter: 0.1 μm)

A-2: barium titanate particles (trade name: BT-02 available from Sakai Chemicals Co., Ltd., mean particle diameter: 0.2 μm)

Phenolic Resin (B1):

B1-1: cresol novolak resin prepared from m-cresol and p-cresol in 60/40 molar ratio (mass-average molecular weight in terms of polystyrene: 8,700)

B1-2: cresol novolak resin prepared from m-cresol and p-cresol in 50/50 molar ratio (mass-average molecular weight in terms of polystyrene: 7,500)

B1-3: polyhydroxystyrene (trade name: MARUKA LYN-CUR S-2P available from Maruzen Petrochemical Co., Ltd.)

Phenolic Compound (b1):

b1-1: 1,1-bis(4-hydroxyphenyl)-1-[4-{1-(4-hydroxyphenyl)-1-methylethyl}phenyl]ethane Quinonediazide Compound (C1):

C1-1: condensate formed between 1,1-bis(4-hydroxyphenyl)-1-[4-[1-(4-hydroxyphenyl)-1-methylethyl]phenyl]ethane and 1,2-naphthoquinonediazido-5-sulfonic acid in an average molar ratio of 1/2.0

C1-2: condensate formed between 1,1-bis(4-hydroxyphenyl)-1-phenylethane and 1,2-naphthoquinonediazido-5-sulfonic acid in an average molar ratio of 1/1.5

Curing Agent (C2):

C2-1: hexamethoxymethylated melamine (trade name: CYMEL 300 available from Mitsui Cytec, Ltd.)

C2-2: tetramethoxymethyl glycoluril (trade name: CYMEL 1174 available from Mitsui Cytec, Ltd.)

Acid Generator (C3):

C3-1: benzyl(4-hydroxyphenyl)methylsulfonium hexafluoroantimonate

C3-2: benzyl(4-hydroxyphenyl)methylsulfonium hexafluorophosphate

Crosslinked Fine Particles (C4):

C4-1: butadiene/hydroxybutyl methacrylate/methacrylic acid/divinylbenzene=60/32/6/2 (wt %), mean particle diameter=65 nm Solvent (D):

D-1: ethyl lactate
D-2: 2-heptanone

Examples 1–5

(1) Preparation of Photosensitive Composition for Forming Dielectric

The inorganic particles (A), phenolic resin (B1), phenolic compound (b1), quinonediazide compound (C1), curing agent (C2), acid generator (C3) and crosslinked fine particles (C4) were dissolved in the solvent (D) in the mixing ratio listed in Table 1. The solution was kneaded in a bead mill and thereafter filtered through a stainless steel mesh (500 mesh) and a filter having a pore size of 1 μm to prepare a photosensitive composition for forming a dielectric.

(2) Application of Photosensitive Composition for Forming Dielectric

The above photosensitive composition was applied by a spinner onto a Cu-sputtered silicon water. The applied composition was dried at 100° C. for 5 minutes to remove the solvent. As a result, a photosensitive dielectric layer was formed in a thickness of 1 μm.

(3) Photoexposure and Development of Dielectric Layer

The photosensitive dielectric layer was irradiated with i-line radiation (ultraviolet ray of 365 nm wavelength) through a photomask (having a pattern with 500 μm squares dots) by use of an ultrahigh pressure mercury lamp. The dose was 500 mJ/cm$^2$.

After the completion of the photoexposure, the photoexposed dielectric layer was treated by a shower development for 2 minutes with an aqueous solution of 2.38% by mass of tetramethylammonium hydroxide (25° C.) as the developer. Thereafter the dielectric layer was washed with ultrapure water to remove the area that had been solubilized by ultraviolet irradiation. Thus, a pattern was formed.

(4) Curing of Dielectric Pattern

The patterned dielectric layer on the silicon wafer was cured in an oven at 200° C. for 60 minutes to form a dielectric pattern on the substrate.

The patterning properties and dielectric properties of the obtained dielectric pattern were measured by the above methods. The results are shown in Table 1.

Comparative Examples 1–5

In the same manner as in the above Examples, a composition was prepared in the mixing ratio listed in Table 2. The properties were measured in the same manner. The results are shown in Table 2.

TABLE 1

|  |  | Ex. 1 |  | Ex. 2 |  | Ex. 3 |  | Ex. 4 |  | Ex. 5 |  |
| --- | --- | --- | --- | --- | --- | --- | --- | --- | --- | --- | --- |
| Photosensitive composition for forming dielectric |  |  |  |  |  |  |  |  |  |  |  |
| Component | Type | PBW* | Type | PBW* | Type | PBW* | Type | PBW* | Type | PBW* |
| (A) Inorganic particles | A-1 | 150 | A-1 | 350 | A-2 | 150 | A-1 | 150 | A-1 | 150 |
| (B1) Phenolic resin | B1-1 | 100 | B1-1 | 100 | B1-1 | 90 | B1-2 | 100 | B1-1/B1-2 | 90/10 |
| (b1) Phenolic compound | — | — | — | — | b1-1 | 10 | — | — | — | — |
| (C1) Quinonediazido compound | C1-1 | 15 | C1-1 | 15 | C1-1 | 15 | C1-2 | 15 | C1-1 | 15 |
| (C2) Curing agent | C2-1 | 23 | C2-1 | 23 | C2-2 | 23 | C2-1 | 23 | C2-1 | 23 |
| (C3) Acid generator | C3-1 | 2 | C3-1 | 2 | C3-1 | 2 | C3-2 | 2 | C3-2 | 2 |
| (C4) Crosslinked fine particles | C4-1 | 10 | C4-1 | 10 | C4-1 | 10 | — | — | C4-1 | 10 |
| (D) Solvent | D-1 | 900 | D-1 | 900 | D-2 | 900 | D-2 | 900 | D-2 | 900 |
| Patterning properties |  |  |  |  |  |  |  |  |  |  |
| Patterning accuracy |  | AA |  | AA |  | AA |  | AA |  | AA |
| Pattern deletion |  | AA |  | AA |  | AA |  | AA |  | AA |
| Characteristics of dielectric |  |  |  |  |  |  |  |  |  |  |
| Thickness (μm) |  | 1 |  | 1 |  | 1 |  | 0.7 |  | 2 |
| Dielectric constant |  | 10 |  | 20 |  | 13 |  | 10 |  | 10 |
| Dielectric loss tangent |  | 0.05 |  | 0.07 |  | 0.05 |  | 0.04 |  | 0.04 |
| Electrostatic capacity (nF/cm$^2$) |  | 10 |  | 20 |  | 13 |  | 14 |  | 5 |
| Moist heat resistance |  | AA |  | AA |  | AA |  | AA |  | AA |
| Leakage current (A/cm$^2$) |  | 10$^{-10}$ |  | 10$^{-10}$ |  | 10$^{-10}$ |  | 10$^{-10}$ |  | 10$^{-10}$ |

*parts by weight

TABLE 2

|  |  | Comp. Ex. 1 |  | Comp. Ex. 2 |  | Comp. Ex. 3 |  | Comp. Ex. 4 |  | Comp. Ex. 5 |  |
| --- | --- | --- | --- | --- | --- | --- | --- | --- | --- | --- | --- |
| Photosensitive composition for forming dielectric |  |  |  |  |  |  |  |  |  |  |  |
| Component | Type | PBW* | Type | PBW* | Type | PBW* | Type | PBW* | Type | PBW* |
| (A) Inorganic particles | A-1 | 150 | A-1 | 150 | A-2 | 150 | A-1 | 150 | A-1 | 150 |
| (B1) Phenolic resin | — | — | B1-1 | 100 | B1-1 | 90 | B1-1 | 100 | B1-1/B1-2 | 90/10 |

TABLE 2-continued

|  | Comp. Ex. 1 | | Comp. Ex. 2 | | Comp. Ex. 3 | | Comp. Ex. 4 | | Comp. Ex. 5 | |
| --- | --- | --- | --- | --- | --- | --- | --- | --- | --- | --- |
| (b1) Phenolic compound | — | | — | | b1-1 | 10 | — | | — | |
| (C1) Quinonediazido compound | C1-1 | 15 | C1-1 | 15 | C1-1 | 15 | — | | C1-1 | 15 |
| (C2) Curing agent | C2-1 | 23 | — | | C2-2 | 23 | C2-1 | 23 | — | |
| (C3) Acid generator | C3-2 | 2 | — | | — | | C3-2 | 2 | C3-2 | 2 |
| (C4) Crosslinked fine particles | C4-1 | 10 | C4-1 | 10 | C4-1 | 10 | C4-1 | 5 | C4-1 | 10 |
| (D) Solvent | D-1 | 900 | D-1 | 900 | D-2 | 900 | D-2 | 900 | D-2 | 900 |
| Patterning properties | | | | | | | | | | |
| Patterning accuracy | BB | | BB | | BB | | BB | | AA | |
| Pattern deletion | — | | BB | | BB | | — | | AA | |
| Characteristics of dielectric | | | | | | | | | | |
| Thickness ($\mu$m) | 1 | | 1 | | 1 | | 1 | | 1 | |
| Dielectric constant | 4 | | 8 | | 13 | | 12 | | 6 | |
| Dielectric loss tangent | 0.15 | | 0.07 | | 0.05 | | 0.04 | | 0.04 | |
| Electrostatic capacity (nF/cm$^2$) | 4 | | 8 | | 13 | | 12 | | 6 | |
| Moist heat resistance | BB | | BB | | AA | | AA | | BB | |
| Leakage current (A/cm$^2$) | $10^{-7}$ | | $10^{-8}$ | | $10^{-10}$ | | $10^{-8}$ | | $10^{-8}$ | |

*parts by weight

Second Photosensitive Composition for Forming Dielectric

The following are a list of the components used in Examples 6–13 and Comparative Examples 6–7 and descriptions of the synthesis of the alkali developable resins (B) used in those embodiments.

Inorganic Particles (A):
A-1: barium titanate particles (trade name: BT-01 available from Sakai Chemicals Co., Ltd., mean particle diameter: 0.1 $\mu$m, dielectric constant: 500)
A-2: barium titanate particles (trade name: BT-02 available from Sakai Chemicals Co., Ltd., mean particle diameter: 0.2 $\mu$m, dielectric constant: 500)
A-3: barium titanate nanoparticles (Nisshin Engineering Inc., mean particle diameter: 0.03 $\mu$m, dielectric constant: 400)
A-4: barium titanate particles (TOHO TITANIUM CO., LTD., mean particle diameter: 0.1 $\mu$m, dielectric constant: 400)
A-5: titania nanoparticles (trade name: RTIPBC available from C.I. KASEI CO., LTD., mean particle diameter: 0.02 $\mu$m, dielectric constant: 100)

Photoacid Generator (C5):
C5-1: ester of 4,4'-[1-[4-(1-(4-hydroxyphenyl)-1-methylethyl)phenyl]ethylidene]diphenol with 1,2-naphthoquinonediazido-5-sulfonic acid (average esterification ratio: 66.7 mol %)

Solvent (D):
D-1: ethyl lactate
D-3: propylene glycol monomethyl ether

Alkali Developable Resin (B):

Synthesis Example 1

A flask purged with nitrogen was charged with 459.0 g of a diethylene glycol dimethyl ether solution in which 9.0 g of 2,2'-azobisisobutyronitrile had been dissolved. Further, 22.5 g of styrene, 45.0 g of methacrylic acid, 67.5 g of dicyclopentanyl methacrylate and 90.0 g of glycidyl methacrylate were added thereto. Then the mixture solution was stirred slowly, and the solution was heated to 80° C., maintained at this temperature for 5 hours and heated at 90° C. for 1 hour to complete the polymerization.

The solution obtained by the above reaction was added dropwise to a large quantity of water to solidify the reaction product. The reaction product was washed with water, redissolved in 200 g of tetrahydrofuran, and resolidified in a large amount of water. This operation through redissolution to resolidification was repeated three times. Thereafter, the resultant solidified product was vacuum dried at 60° C. for 48 hours to yield a copolymer (I).

Synthesis Example 2

A flask purged with nitrogen was charged with 459.0 g of a methyl 3-methoxypropionate solution in which 9.0 g of 2,2'-azobisisobutyronitrile had been dissolved. Further, 56.25 g of methacrylic acid, 90.0 g of methyl methacrylate and 78.75 g of 3,4-epoxybutyl methacrylate were added thereto. Then the mixture solution was stirred slowly, and the polymerization was initiated by heating the solution to 80° C. The solution was maintained at this temperature for 5 hours and heated at 90° C. for 1 hour to complete the polymerization. The resultant solution was treated in the same manner as in Synthesis Example 1 to yield a copolymer (II).

Synthesis Example 3

32.29 g (90 mmol) of 3,3',4,4'-diphenylsulfonetetracarboxylic dianhydride and 3.00 g (10 mmol) of 1,3,3a,4,5,9A-hexahydro-5(tetrahydro-2,5-dioxo-3-furanyl)-naphtho[1,2-c]-furan-1,3-dione as tetracarboxylic dianhydrides; 28.74 g (70 mmol) of 2,2-bis[4-(4-aminophenoxy)phenyl]propane as a diamine compound, 2.49 g (10 mmol) of organosiloxane LP7100 (available from Shin-Etsu Chemical, Co., Ltd.); and 3.04 g (20 mmol) of 3,5-diaminobenzoic acid were dissolved in 450 g of N-methyl-2-pyrrolidone (NMP) and reacted with each other for 12 hours at room temperature. Thereafter, 32 g of pyridine and 71 g of acetic anhydride were added to the reaction solution, and cyclodehydration was carried out at 100° C. for 3 hours. The resultant reaction solution was purified by vacuum distillation to obtain an NMP solution of polyimide with 20% solid concentration.

Example 6

(1) Preparation of Photosensitive Composition for Forming a Dielectric

The inorganic superfine particles (A-I), inorganic fine particles (A-II), alkali developable resin (B), photoacid generator (C5) and solvent (D) in the mixing ratio listed in Table 3 were kneaded in a bead mill. The mixture was thereafter filtered through a stainless steel mesh (500 mesh) and a filter having a pore size of 1 μm to prepare a photosensitive composition for forming a dielectric.

(2) Application of Photosensitive Composition for Forming a Dielectric

The above photosensitive composition was applied by a spinner onto a printed wiring board. The applied composition was dried at 100° C. for 5 minutes to remove the solvent. As a result, a photosensitive dielectric layer was formed in a thickness of 7 μm.

(3) Photoexposure and Development of Dielectric Layer

The photosensitive dielectric layer was irradiated with i-line radiation (ultraviolet ray of 365 nm wavelength) through a photomask (having a pattern with 500 μm squares dots) by use of an ultrahigh pressure mercury lamp. The dose was 100 mJ/cm$^2$.

After the completion of the photoexposure, the photoexposed dielectric layer was treated by a shower development for 2 minutes with an aqueous solution of 0.12% by mass of tetramethylammonium hydroxide (25° C.) as the developer. Thereafter the dielectric layer was washed with ultrapure water to remove the area that had been solubilized by ultraviolet irradiation. Thus, a pattern was formed.

(4) Curing of Dielectric Pattern

The patterned dielectric layer on the printed wiring board was cured in an oven at 200° C. for 60 minutes to form a dielectric pattern on the printed wiring board.

The patterning properties and dielectric properties of the obtained dielectric pattern were measured by the above methods. The results are shown in Table 3.

Example 7

A photosensitive composition for forming a dielectric was prepared in the mixing ratio listed in Table 3 in the same manner as in Example 6. A photosensitive dielectric layer was formed in a thickness of 7 μm and thereafter photoexposed, developed and cured in the same manner as in Example 6 to form a dielectric pattern, except for the use of the above-prepared composition. The resultant dielectric pattern was subjected to the measurements of the patterning properties and dielectric properties. The results are shown in Table 3.

Example 8

A photosensitive composition for forming a dielectric was prepared in the mixing ratio listed in Table 3 in the same manner as in Example 6. A photosensitive dielectric layer was formed in a thickness of 5 μm and thereafter photoexposed, developed and cured in the same manner as in Example 6 to form a dielectric pattern, except for the use of the above-prepared composition. The resultant dielectric pattern was subjected to the measurements of the patterning properties and dielectric properties. The results are shown in Table 3.

Example 9

A photosensitive composition for forming a dielectric was prepared in the mixing ratio listed in Table 3 in the same manner as in Example 6. In this embodiment, the NMP solution of polyimide prepared in Synthesis Example 3 (solid content:solvent=20:80 (by weight)) was used as the alkali developable resin (B) and the solvent (D). A photosensitive dielectric layer was formed in a thickness of 3 μm and thereafter photoexposed, developed and cured in the same manner as in Example 6 to form a dielectric pattern, except that the above-prepared composition was used and the curing was carried out at 230° C. The resultant dielectric pattern was subjected to the measurements of the patterning properties and dielectric properties. The results are shown in Table 3.

Example 10

A photosensitive composition for forming a dielectric was prepared in the mixing ratio listed in Table 3 in the same manner as in Example 6. A photosensitive dielectric layer was formed in a thickness of 3 μm and thereafter photoexposed, developed and cured in the same manner as in Example 6 to form a dielectric pattern, except for the use of the above-prepared composition. The resultant dielectric pattern was subjected to the measurements of the patterning properties and dielectric properties. The results are shown in Table 3.

Comparative Example 6

A photosensitive composition for forming a dielectric was prepared in the mixing ratio listed in Table 3 in the same manner as in Example 6. A photosensitive dielectric layer was formed in a thickness of 3 μm and thereafter photoexposed, developed and cured in the same manner as in Example 6 to form a dielectric pattern, except for the use of the above-prepared composition. The resultant dielectric pattern was subjected to the measurements of the patterning properties and dielectric properties. The results are shown in Table 3.

TABLE 3

| | Ex. 6 | | Ex. 7 | | Ex. 8 | | Ex. 9 | | Ex. 10 | | Comp. Ex. 6 | |
|---|---|---|---|---|---|---|---|---|---|---|---|---|
| Photosensitive composition for forming dielectric | | | | | | | | | | | | |
| Component | Type | Parts | Type | Parts | Type | Parts | Type | Parts | Type | Parts | Type | Parts |
| (A-I) Inorganic superfine particles | A-5 | 15 | A-5 | 15 | A-3 | 10 | A-3 | 10 | A-5 | 10 | — | |
| Material | Titania | | Titania | | Barium titanate | | Barium titanate | | Titania | | | |

TABLE 3-continued

|  | Ex. 6 | | Ex. 7 | | Ex. 8 | | Ex. 9 | | Ex. 10 | | Comp. Ex. 6 | |
|---|---|---|---|---|---|---|---|---|---|---|---|---|
| Ave. particle diameter (μm) | 0.02 | | 0.02 | | 0.03 | | 0.03 | | 0.02 | | | |
| (A-II) Inorganic superfine particles | A-1 | 85 | A-1 | 85 | A-1 | 90 | A-4 | 90 | A-4 | 90 | A-2 | 100 |
| Material | Barium titanate | | Barium titanate | | Barium titanate | | Barium titanate | | Barium titanate | | Barium titanate | |
| Ave. particle diameter (μm) | 0.1 | | 0.1 | | 0.1 | | 0.1 | | 0.1 | | 0.2 | |
| (B) Alkali developable resin | Copolymer (I) | | Copolymer (II) | | Copolymer (I) | | Polyimide | | Copolymer (I) | | Copolymer (I) | |
| Weight-average molecular weight (Mw) | 50,000 | | 100,000 | | 50,000 | | 80,000 | | 50,000 | | 50,000 | |
| Parts by weight | 30 | | 25 | | 30 | | 30 | | 30 | | 30 | |
| (C5) Photoacid generator | C5-1 | 2 | C5-1 | 2 | C5-1 | 2 | C5-1 | 2 | C5-1 | 2 | C5-1 | 2 |
| (D) Solvent | D-1 | 50 | D-1 | 50 | D-1 | 50 | NMP | 120 | D-1 | 50 | D-1 | 50 |
|  | D-3 | 50 | D-3 | 50 | D-3 | 50 | | | D-3 | 50 | D-3 | 50 |
| Patterning properties | | | | | | | | | | | | |
| Patterning accuracy | AA | | AA | | AA | | AA | | AA | | AA | |
| Pattern deletion | AA | | AA | | AA | | AA | | AA | | AA | |
| Characteristics of dielectric | | | | | | | | | | | | |
| Thickness (μm) | 7 | | 7 | | 5 | | 3 | | 3 | | 7 | |
| Dielectric constant | 23 | | 25 | | 30 | | 28 | | 25 | | 15 | |
| Dielectric loss tangent | 0.05 | | 0.04 | | 0.05 | | 0.04 | | 0.04 | | 0.03 | |
| Moist heat resistance | AA | | AA | | AA | | AA | | AA | | AA | |
| Leakage current (A/cm$^2$) | $10^{-11}$ | | $10^{-11}$ | | $10^{-11}$ | | $10^{-11}$ | | $10^{-11}$ | | $10^{-9}$ | |

Example 11

(1) Preparation of Photosensitive Composition for Forming Dielectric

A photosensitive composition for forming a dielectric was prepared in the mixing ratio listed in Table 3 in the same manner as in Example 6.

(2) Preparation of Photosensitive Transfer Film

The above-obtained composition was applied onto a copper foil substrate film (300 mm wide, 500 mm long and 13 μm thick) with a die coater. The applied composition was dried at 100° C. for 5 minutes to remove the solvent. As a consequence, a photosensitive transfer layer for forming a dielectric was formed in a thickness of 10 μm on the substrate film to prepare a photosensitive transfer film.

(3) Transferring of Photosensitive Transfer Layer

The photosensitive transfer film was superposed on a printed wiring board so that the photosensitive transfer layer would be in contact with the printed wiring board. Thereafter, the photosensitive transfer film was thermocompression bonded with the board by use of a heating roller. The thermocompression bonding conditions were such that the heating roller had a surface temperature of 120° C., a rolling pressure of 4 kg/cm$^2$, and a traveling speed of 0.5 m/min. As a result, the copper-foiled photosensitive layer for forming a dielectric was transferred on the printed wiring board to obtain a board with the photosensitive dielectric layer. The thickness of the photosensitive dielectric layer was measured to be 10±1 μm.

(4) Photoexposure and Development of Dielectric Layer

A positive DFR was laminated on the above-formed multilayered board. The resultant laminate was irradiated through a photomask (having a pattern with 500 μm squares dots) with i-line radiation (ultraviolet ray of 365 nm wavelength) by use of an ultrahigh high pressure mercury lamp. The photoexposed DFR layer was then developed by the conventional method. Uncoated areas of the copper foil given by the development were chemically etched with a cupric chloride solution to form a photosensitive dielectric layer with a patterned copper foil. While using the copper foil pattern as a photomask, the photosensitive dielectric layer was photoexposed with an ultrahigh pressure mercury lamp. The dose was 400 mJ/cm$^2$.

After the completion of the photoexposure, the exposed dielectric layer was treated by a shower development for 2 minutes with an aqueous solution of 0.12% by mass of tetramethylammonium hydroxide (30° C.) as the developer. Thereafter the dielectric layer was washed with ultrapure water to remove the area that had been solubilized by ultraviolet irradiation. Thus, a pattern was formed.

(5) Curing of Dielectric Pattern

The patterned dielectric layer with the copper foil on the printed wiring board was cured in an oven at 200° C. for 30 minutes to form a dielectric pattern with the copper foil on the printed wiring board.

The patterning properties and dielectric properties of the obtained dielectric pattern were measured by the above methods. The results are shown in Table 4.

Example 12

A photosensitive composition for forming a dielectric was prepared in the mixing ratio listed in Table 4 in the same manner as in Example 6. A photosensitive dielectric layer was formed in a thickness of 10 μm and thereafter photoexposed, developed and cured in the same manner as in Example 11 to form a dielectric pattern, except for the use of the above-prepared composition. The resultant dielectric pattern was subjected to the measurements of the patterning properties and dielectric properties. The results are shown in Table 4.

Example 13

A photosensitive composition for forming a dielectric was prepared in the mixing ratio listed in Table 4 in the same manner as in Example 6. In this embodiment, the NMP solution of polyimide prepared in Synthesis Example 3

(solid content:solvent=20:80 (by weight)) was used as the alkali developable resin (B) and the solvent (D). A photosensitive dielectric layer was formed in a thickness of 10 µm and thereafter photoexposed, developed and cured in the same manner as in Example 11 to form a dielectric pattern, except that the above-prepared composition was used and the curing was carried out at 230° C. The resultant dielectric pattern was subjected to the measurements of the patterning properties and dielectric properties. The results are shown in Table 4.

Comparative Example 7

A photosensitive composition for forming a dielectric was prepared in the mixing ratio listed in Table 4 in the same manner as in Example 6. A photosensitive dielectric layer was formed in a thickness of 10 µm and thereafter photoexposed, developed and cured in the same manner as in Example 11 to form a dielectric pattern, except for the use of the above-prepared composition. The resultant dielectric pattern was subjected to the measurements of the patterning properties and dielectric properties. The results are shown in Table 4.

A-4: barium titanate particles (TOHO TITANIUM CO., LTD., mean particle diameter: 0.1 µm, dielectric constant: 400)

A-5: titania nanoparticles (trade name: RTIPBC available from C.I. KASEI CO., LTD., mean particle diameter: 0.02 µm, dielectric constant: 100)

Alkali Soluble Resin (B2):

B2-1: copolymer prepared from n-butyl methacrylate, 3-hydroxypropyl methacrylate and methacrylic acid in 60/20/20 ratio (% by mass) (Mw: 50,000)

B2-2: copolymer prepared from n-butyl methacrylate, 3-hydroxypropyl methacrylate and methacrylic acid in 60/20/20 ratio (% by mass) (Mw: 100,000)

Compound having Ethylenically Unsaturated Group (C6):
C6-1: trimethylolpropane triacrylate Photopolymerization Initiator (C7):
C7-1: 2-benzyl-2-dimethylamino-1-(4-morpholinophenyl) butane-1-one Solvent (D):
D-3: propylene glycol monomethyl ether

TABLE 4

| | Ex. 11 | | Ex. 12 | | Ex. 13 | | Comp. Ex. 7 | |
|---|---|---|---|---|---|---|---|---|
| Photosensitive composition for forming dielectric | | | | | | | | |
| Component | Type | Parts | Type | Parts | Type | Parts | Type | Parts |
| (A-I) Inorganic superfine particles | A-5 | 15 | A-3 | 10 | A-3 | 10 | — | |
| Material | Titania | | Barium titanate | | Barium titanate | | | |
| Average particle diameter. (µm) | 0.02 | | 0.03 | | 0.03 | | | |
| (A-II) Inorganic superfine particles | A-1 | 85 | A-1 | 90 | A-4 | 90 | A-2 | 100 |
| Material | Barium titanate | | Barium titanate | | Barium titanate | | Barium titanate | |
| Average particle diameter (µm) | 0.1 | | 0.1 | | 0.1 | | 0.2 | |
| (B) Alkali developable resin | Copolymer (I) | | Copolymer (I) | | Polyimide | | Copolymer (I) | |
| Weight-average molecular weight (Mw) | 50,000 | | 50,000 | | 80,000 | | 50,000 | |
| Parts by weight | 35 | | 35 | | 40 | | 35 | |
| (C5) Photoacid generator | C5-1 | 2 | C5-1 | 2 | C5-1 | 2 | C5-1 | 2 |
| (D) Solvent | D-1 | 75 | D-1 | 75 | NMP | 160 | D-1 | 75 |
| | D-3 | 75 | D-3 | 75 | | | D-3 | 75 |
| Patterning properties | | | | | | | | |
| Patterning accuracy | AA | | AA | | AA | | AA | |
| Pattern deletion | AA | | AA | | AA | | AA | |
| Characteristics of dielectric | | | | | | | | |
| Thickness (µm) | 10 | | 10 | | 10 | | 10 | |
| Dielectric constant | 20 | | 20 | | 20 | | 13 | |
| Dielectric loss tangent | 0.04 | | 0.04 | | 0.04 | | 0.03 | |
| Moist heat resistance | AA | | AA | | AA | | AA | |
| Leakage current (A/cm$^2$) | $10^{-12}$ | | $10^{-12}$ | | $10^{-12}$ | | $10^{-12}$ | |

Third Photosensitive Composition for Forming Dielectric

The following is a list of the components used in Examples 14–17 and Reference Examples 1–2.

Inorganic Particles (A):

A-1: barium titanate particles (trade name: BT-01 available from Sakai Chemicals Co., Ltd., mean particle diameter: 0.1 µm, dielectric constant: 500)

A-3: barium titanate nanoparticles (Nisshin Engineering Inc., mean particle diameter: 0.03 µm, dielectric constant: 400)

Dispersant (E1):
E1-1: oleic acid

Filler (E2):
E2-1: acetylene black

Examples 14

(1) Preparation of Photosensitive Composition for Forming Dielectric

The inorganic superfine particles (A-I), inorganic fine particles (A-II), alkali soluble resin (B2), compound having an ethylenically unsaturated group (C6), photopolymerization initiator (C7), solvent (D), dispersant (E) and filler (F) in the mixing ratio listed in Table 5, were kneaded together in a bead mill. Then, the mixture was filtered through a stainless steel mesh (500 mesh) to yield a photosensitive composition for forming a dielectric.

(2) Application of Photosensitive Composition for Forming Dielectric

The above photosensitive composition was applied by a spinner onto a printed wiring board. The applied composition was dried at 100° C. for 5 minutes to remove the solvent. As a result, a photosensitive dielectric layer was formed in a thickness of 7 μm.

(3) Photoexposure and Development of Dielectric Layer

The photosensitive dielectric layer was irradiated with i-line radiation (ultraviolet ray of 365 nm wavelength) through a photomask (having a pattern with 500 μm squares dots) by use of a ultrahigh pressure mercury lamp. The dose was 400 mJ/cm².

After the completion of the photoexposure, the photoexposed dielectric layer was treated by a shower development for 1 minute with an aqueous solution of 0.5% by mass of sodium carbonate (30° C.) as the developer. Thereafter the dielectric layer was washed with ultrapure water to remove the uncured area, which had not been exposed to ultraviolet irradiation. Thus, a pattern was formed.

(4) Curing of Dielectric Pattern

The patterned dielectric layer on the printed wiring board was cured in an oven at 200° C. for 30 minutes to form a dielectric pattern on the printed wiring board.

The patterning properties and dielectric properties of the obtained dielectric pattern were measured by the above methods. The results are shown in Table 5.

Example 15

A photosensitive composition for forming a dielectric was prepared in the mixing ratio listed in Table 5 in the same manner as in Example 14. A photosensitive dielectric layer was formed in a thickness of 7 μm and thereafter photoexposed, developed and cured in the same manner as in Example 14 to form a dielectric pattern, except for the use of the above-prepared composition. The resultant dielectric pattern was subjected to the measurements of the patterning properties and dielectric properties. The results are shown in Table 4.

Example 16

A photosensitive composition for forming a dielectric was prepared in the mixing ratio listed in Table 5 in the same manner as in Example 14. A photosensitive dielectric layer was formed in a thickness of 5 μm and thereafter photoexposed, developed and cured in the same manner as in Example 14 to form a dielectric pattern, except for the use of the above-prepared composition. The resultant dielectric pattern was subjected to the measurements of the patterning properties and dielectric properties. The results are shown in Table 4.

Example 17

A photosensitive composition for forming a dielectric was prepared in the mixing ratio listed in Table 5 in the same manner as in Example 14. A photosensitive dielectric layer was formed in a thickness of 3 μm and thereafter photoexposed, developed and cured in the same manner as in Example 14 to form a dielectric pattern, except for the use of the above-prepared composition. The resultant dielectric pattern was subjected to the measurements of the patterning properties and dielectric properties. The results are shown in Table 4.

Reference Example 1

A photosensitive composition for forming a dielectric was prepared in the mixing ratio listed in Table 5 in the same manner as in Example 14. A photosensitive dielectric layer was formed in a thickness of 7 μm and thereafter photoexposed, developed and cured in the same manner as in Example 14 to form a dielectric pattern, except for the use of the above-prepared composition. The resultant dielectric pattern was subjected to the measurements of the patterning properties and dielectric properties. The results are shown in Table 4.

Reference Example 2

A photosensitive composition for forming a dielectric was prepared in the mixing ratio listed in Table 5 in the same manner as in Example 14. A photosensitive dielectric layer was formed in a thickness of 5 μm and thereafter photoexposed, developed and cured in the same manner as in Example 14 to form a dielectric pattern, except for the use of the above-prepared composition. The resultant dielectric pattern was subjected to the measurements of the patterning properties and dielectric properties. The results are shown in Table 4.

TABLE 5

| | Ex. 14 | | Ex. 15 | | Ex. 16 | | Ex. 17 | | Ref. Ex. 1 | | Ref. Ex. 2 | |
|---|---|---|---|---|---|---|---|---|---|---|---|---|
| Photosensitive composition for forming dielectric | | | | | | | | | | | | |
| Component | Type | Parts | Type | Parts | Type | Parts | Type | Parts | Type | Parts | Type | Parts |
| (A-I) Inorganic superfine particles | A-5 | 15 | A-5 | 15 | A-3 | 10 | A-3 | 10 | A-5 | 15 | A-5 | 15 |
| Material | Titania | | Titania | | Barium titanate | | Barium titanate | | Titania | | Titania | |
| Ave. particle diameter (μm) | 0.02 | | 0.02 | | 0.03 | | 0.03 | | 0.02 | | 0.02 | |
| (A-II) Inorganic superfine particles | A-1 | 85 | A-1 | 85 | A-1 | 90 | A-4 | 90 | A-1 | 85 | A-1 | 85 |
| Material | Barium titanate | | Barium titanate | | Barium titanate | | Barium titanate | | Barium titanate | | Barium titanate | |

TABLE 5-continued

|  | Ex. 14 | | Ex. 15 | | Ex. 16 | | Ex. 17 | | Ref. Ex. 1 | | Ref. Ex. 2 | |
| --- | --- | --- | --- | --- | --- | --- | --- | --- | --- | --- | --- | --- |
| Ave. particle diameter ($\mu$m) | 0.1 | | 0.1 | | 0.1 | | 0.1 | | 0.1 | | 0.1 | |
| (B2) Alkali soluble resin | B2-1 | | B2-2 | | B2-1 | | B2-1 | | B2-1 | | B2-1 | |
| Weight-average molecular weight (Mw) | 50,000 | | 100,000 | | 50,000 | | 50,000 | | 50,000 | | 50,000 | |
| Parts by weight | 20 | | 20 | | 20 | | 20 | | 20 | | 20 | |
| (C6) Ethylenically unsaturated group-containing compound | C6-1 | 10 | C6-1 | 10 | C6-1 | 10 | C6-1 | 10 | C6-1 | 1 | C6-1 | 50 |
| (C7) Photopolymerization initiator | C7-1 | 1 | C7-1 | 1 | C7-1 | 1 | C7-1 | 1 | C7-1 | 1 | C7-1 | 1 |
| (D) Solvent | D-3 | 100 | D-3 | 100 | D-3 | 100 | D-3 | 100 | D-3 | 100 | D-3 | 100 |
| (E1) Dispersant | E1-1 | 1 | E1-1 | 1 | E1-1 | 1 | E1-1 | 1 | E1-1 | 1 | E1-1 | 1 |
| (E2) Filler | E2-1 | 0.5 | E2-1 | 0.5 | E2-1 | 0.5 | E2-1 | 0.5 | E2-1 | 0.5 | E2-1 | 0.5 |
| Patterning properties | | | | | | | | | | | | |
| Patterning accuracy | AA | | AA | | AA | | AA | | BB | | BB | |
| Pattern deletion | AA | | AA | | AA | | AA | | BB | | AA | |
| Characteristics of dielectric | | | | | | | | | | | | |
| Thickness ($\mu$m) | 7 | | 7 | | 5 | | 3 | | 7 | | 5 | |
| Dielectric constant | 20 | | 22 | | 30 | | 28 | | 25 | | 18 | |
| Dielectric loss tangent | 0.05 | | 0.04 | | 0.04 | | 0.04 | | 0.2 | | 0.05 | |
| Moist heat resistance | AA | | AA | | AA | | AA | | BB | | AA | |
| Leakage current (A/cm$^2$) | $10^{-11}$ | | $10^{-11}$ | | $10^{-11}$ | | $10^{-11}$ | | $10^{-8}$ | | $10^{-11}$ | |

What is claimed is:

1. A photosensitive composition for forming a dielectric comprising (A) inorganic particles, (B) an alkali developable resin, and (C) an additive, wherein:
the inorganic particles (A) comprise inorganic superfine particles (A-I) having a mean particle diameter of less than 0.05 $\mu$m and inorganic fine particles (A-II) having a mean particle diameter of not less than 0.05 $\mu$m; and
the additive (C) comprises a photoacid generator (C5).

2. The photosensitive composition for forming a dielectric as claimed in claim 1, wherein the inorganic superfine particles (A-I) are contained at 1 to 30 parts by mass and the inorganic fine particles (A-II) are contained at 99 to 70 parts by mass on the basis of 100 parts by mass of the inorganic particles (A).

3. The photosensitive composition for forming a dielectric as claimed in claim 1, wherein the inorganic particles (A) are contained at 20 to 95% by mass, the alkali developable resin (B) is contained at 1 to 60% by mass and the photoacid generator (C5) is contained at 0.1 to 30% by mass.

4. The photosensitive composition for forming a dielectric as claimed in claim 1, which is capable of forming a dielectric by heating at 500° C. or below, said dielectric having a dielectric constant of not less than 20 and a dielectric loss tangent of not more than 0.1.

5. The photosensitive composition for forming a dielectric as claimed in claim 1, wherein the inorganic particles (A) comprise a titanium-containing metal oxide.

6. The photosensitive composition for forming a dielectric as claimed in claim 1, wherein the alkali developable resin (B) is at least one resin selected from the group consisting of a (meth)acrylic resin, a hydroxystyrene resin, a novolak resin, a polyester resin, a polyimide resin, a nylon resin and a polyetherimide resin.

7. A photosensitive composition for forming a dielectric comprising (A) inorganic particles, (B) an alkali developable resin, and (C) additives, wherein:
the inorganic particles (A) comprise inorganic superfine particles (A-I) having a mean particle diameter of less than 0.05 $\mu$m and inorganic fine particles (A-II) having a mean particle diameter of not less than 0.05 $\mu$m;
the alkali developable resin (B) comprises an alkali soluble resin (B2); and
the additives (C) comprise a compound having an ethylenically unsaturated group (C6) and a photopolymerization initiator (C7).

8. The photosensitive composition for forming a dielectric as claimed in claim 7, wherein the inorganic superfine particles (A-I) are contained at 1 to 30 parts by mass and the inorganic fine particles (A-II) are contained at 99 to 70 parts by mass on the basis of 100 parts by mass of the inorganic particles (A).

9. The photosensitive composition for forming a dielectric as claimed in claim 7, wherein the inorganic particles (A) are contained at 20 to 95% by mass, the alkali soluble resin (B2) is contained at 1 to 60% by mass, the compound having an ethylenically unsaturated group (C6) is contained at 0.1 to 30% by mass and the photopolymerization initiator (C7) is contained at 0.1 to 20% by mass.

10. The photosensitive composition for forming a dielectric as claimed in claim 7, which is capable of forming a dielectric by heating at 500° C. or below, said dielectric having a dielectric constant of not less than 20 and a dielectric loss tangent of not more than 0.1.

11. The photosensitive composition for forming a dielectric as claimed in claim 7, wherein the inorganic particles (A) comprise a titanium-containing metal oxide.

12. The photosensitive composition for forming a dielectric as claimed in claim 7, wherein the alkali soluble resin (B2) is a resin selected from the group consisting of a (meth)acrylic resin, a hydroxystyrene resin, a novolak resin and a polyester resin.

13. The photosensitive composition for forming a dielectric as claimed in claim 7, wherein the compound having an ethylenically unsaturated group (C6) is a (meth)acrylate compound.

14. The photosensitive composition for forming a dielectric as claimed in claim 7, wherein the compound having an ethylenically unsaturated group (C6) is contained at 20 to 500 parts by mass based on 100 parts by mass of the alkali soluble resin (B2).

15. A dielectric prepared from the photosensitive compositions for forming a dielectric as claimed in claim 1.

16. A dielectric prepared by heating the photosensitive compositions for forming a dielectric as claimed in claim 1 at 500° C. or below to cure the same, said dielectric having a dielectric constant of not less than 20 and a dielectric loss tangent of not more than 0.1.

17. An electronic part including the dielectric as claimed in claim 15.

* * * * *